(12) United States Patent
Inoue

(10) Patent No.: US 7,848,161 B2
(45) Date of Patent: Dec. 7, 2010

(54) SEMICONDUCTOR MEMORY DEVICE

(75) Inventor: Kohji Inoue, Fukuyama (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 530 days.

(21) Appl. No.: 11/993,595

(22) PCT Filed: Jun. 23, 2006

(86) PCT No.: PCT/JP2006/312616

§ 371 (c)(1),
(2), (4) Date: Dec. 21, 2007

(87) PCT Pub. No.: WO2007/004444

PCT Pub. Date: Jan. 11, 2007

(65) Prior Publication Data

US 2010/0046272 A1    Feb. 25, 2010

(30) Foreign Application Priority Data

Jun. 30, 2005    (JP) .............................. 2005-191252

(51) Int. Cl.
*G11C 7/00* (2006.01)
(52) U.S. Cl. .............. 365/189.16; 365/63; 365/189.14; 365/185.18
(58) Field of Classification Search .................. 365/63, 365/189.14, 189.16, 158, 185.18
See application file for complete search history.

(56) References Cited

U.S. PATENT DOCUMENTS 5,831,892 A * 11/1998 Thewes et al. ................ 365/94

| | | | |
|---|---|---|---|
| 6,822,897 B2 * | 11/2004 | Ishikawa | ................. 365/171 |
| 2002/0034117 A1 | 3/2002 | Okazawa | |
| 2003/0123199 A1 | 7/2003 | Honda et al. | |
| 2004/0233709 A1 | 11/2004 | Tsuchida et al. | |

FOREIGN PATENT DOCUMENTS

| JP | 2002-170379 A | 6/2002 |
|---|---|---|
| JP | 2003-249629 | 9/2003 |
| JP | 2003-258204 | 9/2003 |
| JP | 2004-047904 | 2/2004 |

OTHER PUBLICATIONS

International Search Report dated Aug. 22, 2006.
Chen et al.: "An Access-Transistor-Free (0T/1R) Non-Volatile Resistance Random Access memory (RRAM) Using a Novel Threshold, Switching, Self-Rectifying Chalcogenide Device", Electron Devices Meetings, 2003, IEDM '03 Technical Digest, IEEE International.

* cited by examiner

*Primary Examiner*—Son Dinh
(74) *Attorney, Agent, or Firm*—Nixon & Vanderhye, P.C.

(57) ABSTRACT

A semiconductor memory device comprising a memory cell array of cross-point type having memory cells each composed of a variable resistive element for storing information in the form of variation of the electrical resistance. The operating current in the programming operation is reduced. Main data lines (GDL0 to GDL7) for supplying predetermined data line voltages to each of the corresponding data lines (DL0 to DL7) of the memory cell arrays (BK0 to BK3) arranged at least in the row direction extend in the row direction and are connected to the corresponding data lines (DL0 to DL7) through individual data line selecting transistors (TD0*k* to TD7*k*) in the memory cell arrays (BK0 to BK3). The number of data lines (DL0 to DL7) of the memory cell arrays (BK0 to BK3) is equal to the largest number of memory cells in which data is simultaneously programmed in one write operation.

22 Claims, 24 Drawing Sheets

SEMICONDUCTOR MEMORY DEVICE

CROSS-REFERENCE TO RELATED APPLICATIONS

This application is a National Phase filing under 35 U.S.C. §371 of International Application No. PCT/JP2006/312616 filed on Jun. 23, 2006, and which claims priority to Japanese Patent Application No. 2005-191252 filed on Jun. 30, 2005.

TECHNICAL FIELD

The present invention relates to a semiconductor memory device having a cross point-type memory cell array in which memory cells each configured by a variable resistance element storing information by a change of electric resistance are arranged in each of a row direction and a column direction and each of the memory cells in the same row has one end connected to a common data line and each of the memory cells in the same column has the other end connected to a common bit line.

BACKGROUND ART

Recently, a cross point-type semiconductor memory device (referred to as the "cross point memory" occasionally hereinafter) comprising a memory cell array in which a memory cell is not provided with a selection element other than a memory element, and the memory element is directly connected to a data line (row selection line) and a bit line (column selection line) in the memory cell has been developed (refer to the following Non-patent document 1 and Patent document 1, for example).

According to the cross point memory, the memory cell is so constituted that a variable resistance element is positioned at a cross point of the data line and bit line of the memory cell array and one of a lower electrode and an upper electrode of each variable resistance element is connected to the data line and the other is connected to the bit line. For example, the following Non-patent document 1 discloses a variable resistance-type nonvolatile memory (TF-RRAM) in which a chalcogenide material is used and a resistance value is changed by applying an electric pulse to a memory cell.

The following Non-patent document 1 proposes a ½ bias method and a ⅓ bias method as a method of applying a programming voltage to a data line and a bit line, at the time of a programming action in a predetermined memory cell in a memory cell array. FIG. 20 shows voltage applied states of the data line and the bit line in the ½ bias method, and FIG. 21 shows voltage applied states of the data line and the bit line in the ⅓ bias method.

As shown in FIG. 20, according to the ½ bias method, in order to perform programming by changing resistance by applying a bias voltage to a variable resistance element of the selected memory cell enclosed with a circle (the memory cell enclosed with a circle in the figure), a first programming voltage (Vw, for example) and a second programming voltage (0V, for example) are applied to a selected data line and a selected bit line connected to the selected memory cell, respectively. At this time, a middle voltage Vw/2 that is the half of the programming voltage Vw is applied to non-selected data lines and non-selected bit lines which are not connected to the selected memory cell so that the programming voltage Vw (=Vw−0V) is not applied to non-selected memory cells which are not to be programmed. That is, in order to prevent the non-selected memory cells that are not to be programmed from being programmed, the low middle voltage that is not enough for the programming is positively applied to the non-selected memory cells connected to the selected data line and the selected bit line. Therefore, according to the ½ bias method, since the middle voltage (the half of the programming voltage Vw) is applied to both the non-selected memory cells connected to the selected data line and the non-selected memory cells connected to the selected bit line (the memory cells enclosed with rhombuses in the figure), a bias current is generated and the problem is that programming current is increased.

As shown in FIG. 21, according to the ⅓ bias method, in order to perform programming by changing resistance by applying a bias voltage to a variable resistance element of the selected memory cell enclosed with a circle (the memory cell enclosed with a circle in the figure), a first programming voltage (Vw, for example) and a second programming voltage (0V, for example) are applied to a selected data line and a selected bit line connected to the selected memory cell, respectively. At this time, a voltage Vw/3 that is one third of the programming voltage Vw is applied to non-selected data lines not connected to the selected memory cell and a voltage 2Vw/3 that is two thirds of the programming voltage Vw is applied to non-selected bit lines not connected to the selected memory cell, so that the programming voltage Vw (=Vw−0V) is not applied to non-selected memory cells which are not to be programmed. That is, in order to prevent the non-selected memory cells that are not to be programmed from being programmed, a bias voltage (|Vw/3|) that is not enough for the programming is positively applied to all the non-selected memory cells so that the programming voltage is not directly applied to the non-selected memory cells. Therefore, according to the ⅓ bias method, since the low bias voltage (one third of the programming voltage Vw) is applied to both the non-selected memory cells connected to the selected data line and the non-selected memory cells connected to the selected bit line (the memory cells enclosed with rhombuses in the figure) and remaining all the non-selected memory cells connected to the non-selected data lines or the non-selected bit lines, a bias current is generated in all the non-selected memory cells, and the problem is that programming current is increased. In addition, according to the ⅓ bias method, although the bias voltage applied to each non-selected memory cell is lower than that in the ½ bias method, since the number of non-selected memory cells receiving the bias voltage is greatly increased, the programming current is considerably increased.

In addition, the following Patent document 1 proposes a memory cell array constitution suitable for high concentration of memory cells of a MRAM (Magnetic Random Access Memory). In addition, the MRAM is a nonvolatile memory device using a tunneling magnetoresistive (referred to as the TMR hereinafter), whose programming method is different from that in the variable resistance-type nonvolatile memory disclosed in the Non-patent document 1. FIG. 22 shows a main circuit constitution proposed in the Patent document 1.

As shown in FIG. 22, according to the circuit constitution of the MRAM disclosed in the Patent document 1, a memory cell array MA has a plurality of TMR elements 12 arranged in an X direction (row direction) and a Y direction (column direction) in the shape of an array. In the X direction, j pieces of TMR elements 12 are arranged and in the Y direction (4×n) pieces of TMR elements 12 are arranged.

The four TMR elements 12 arranged in the Y direction constitute one reading block BKik (i=1 to j, k=1 to n). One row is provided by j pieces of reading blocks BKik arranged in the X direction. The memory cell array MA has n rows. In addition, one column is provided by n pieces of reading blocks BKik arranged in the Y direction. The memory cell array MA has j columns. First ends of the four TMR elements 12 in the block BKik are commonly connected, for example, connected to a source line SLi (i=1 . . . j) through a reading selection switch RSW1 configured by a MOS transistor. The source line SLi extends in the Y direction and only one is provided in one column, for example. The source line SLi is connected to a ground point Vss through a column selection switch CSW configured by a MOS transistor, for example.

In this circuit constitution, the memory array in which j pieces of reading blocks BK11 constituted by the four TMR elements 4 are arranged in the X direction and one reading block BK11 is arranged in the Y direction is called a bank (basic cell array block). Bank selection transistors RSW2 and RSW1 for selecting the bank are provided on the row side and the column side, respectively. In addition, the memory array in FIG. 22 comprises n pieces of banks arranged in the Y direction.

Meanwhile, since the memory cell shown in FIG. 22 is the TMR element of the MRAM, a current does not flow in the TMR element of the memory cell at the time of a programming action, so that a current does not flow in the bank selection transistors RSW2 and RSW1. At the time of reading action, a current flowing in the TMR element of the memory cell that is proportional to the resistance value of this element is detected to determine 1 or 0. Therefore, only at the time of reading action, a small current flows through the bank selection transistors. That is, since a large current required for the programming action does not flow in the bank selection transistors, and the bank selection transistors supply only the small current at the time of reading action, the size of the bank selection transistors is relatively small.

However, in the variable resistance-type nonvolatile memory in which change in resistance value is detected by applying an electric pulse to a metal oxide containing transition metal oxide such as $Pr_{1-x}Ca_xMnO_3$(PCMO), $NiO_2$, $TiO_2$, $HfO_2$, and $ZrO_2$ having a perovskite structure, a current flows in the memory cell also at the time of programming action. Therefore, it is necessary to supply a current required for the programming action to a bank to be programmed through the bank selection transistor. Since the current required for the programming action is larger than that flowing at the time of reading action, the size of the bank selection transistor is larger than that of the bank selection transistor required in the MRAM.

FIG. 23 shows a circuit constitution of a cross point-type memory cell array including a variable resistance element formed of a metal oxide such as PCMO in a memory cell. In FIG. 23, peripheral circuits such as a row decoder and a column decoder are not shown and only a memory cell array and a transistor for controlling the memory cell array are shown. In addition, the number of variable resistance elements in the basic memory array corresponding to the reading bank BK11 in FIG. 22 is eight and the memory cell array is provided by arranging the 128 basic memory arrays in the row direction and one in the Y direction to constitute one bank (basic memory cell array bank) in FIG. 23. Bank selection transistors RBS0 to 7 (not shown) for selecting the bank are provided on the side of the row and bank selection transistors CBS0 to 127 (not shown) are provided on the side of the column. In addition, FIG. 23 shows the memory cell array in which only one bank is provided in the Y direction.

FIG. 23 shows current flows with solid line arrows and broken line arrows when the programming action is performed in six selected memory cells connected to a bit line BL2 to be programmed and enclosed with circles, at the same time. In addition, the six selected memory cells are provided at the cross points of data lines DL0, 1, 2, 4, 5, and 7 and the bit line BL2, and the broken line arrow shows a bias current flowing in non-selected memory cells on the data line DL0. The programming method is the above ½ bias method in which the programming voltage Vw is applied to the selected data lines DL0, 1, 2, 4, 5, and 7, 0V is applied to the selected bit line BL2, and the middle voltage Vw/2 that is the half of the programming voltage Vw is applied to the non-selected data lines DL3 and 6, and the non-selected bit lines BL0, 1, 3 to 127.

A current IR0 flowing in the bank selection transistor RBS0 connected to the data line DL0 is calculated. It is assumed that a programming current of about 75 μA is generated in the selected memory cells. In addition, since the bias voltage of Vw/2 is applied to each of the other 127 non-selected memory cells connected to the data line DL0, a bias current Ibias0 is generated. This bias current Ibias0 is expressed by the following equation (1) and the current IR0 is expressed by the following equation (2). Here, it is assumed that the bias voltage Vw/2 is 2V, each resistance value R of the non-selected memory cells is a low resistance value of 50 kΩ.

$$Ibias0 = Vw/(2 \times R) \times 127 = 2[V]/50[k\Omega] \times 127 = 5.08 \text{ [mA]} \quad (1)$$

$$IR0 = 0.075 \text{ [mA]} + Ibias0 = 5.155 \text{ [mA]} \quad (2)$$

In a case where a data width of the variable resistance-type nonvolatile memory is eight bits and one bit is stored in each memory cell, when the programming action is performed for the six memory cells of the eight memory cells connected to the bit line BL2 shown in FIG. 23 at the same time, since a current having the same current value as the IR0 flows in the bank selection transistors RBS0, 1, 2, 4, 5 and 7 at the same time, its total current value IW is expressed by the following equation (3), so that it can be seen that the current at the time of programming action is increased.

$$IW = 5.155 \times 6 = 30.9 \text{ [mA]} \quad (3)$$

As described above, when the programming method proposed in the Non-patent document 1 is used in the variable resistance-type nonvolatile memory having a variable resistance element whose resistance value is changed by electric pulse application and which is formed of PCMO having a perovskite structure, metal oxide containing transition metal oxide such as $NiO_2$, $TiO_2$, $HfO_2$ and $ZrO_2$, or a chalcogenide compound, such as an OUM (ovonic memory), the current at the time of programming action is increased.

Since the fact that there are many non-selected memory cells connected to the selected data line causes the current at the time of programming action to be increased, it is considered that the number of columns constituting one bank is reduced from 128 to 32, for example. When one bank has a constitution of 8 rows×32 columns, a bias current Ibias0' per selected data line, a current IR0' flowing in the bank selection transistor RBS0 and a total current value IW' are considerably reduced as shown in the following equations (4) to (6).

$$Ibias0' = Vw/(2 \times R) \times 31 = 2[V]/50 \text{ [k}\Omega\text{]} \times 31 = 1.24 \text{ [mA]} \quad (4)$$

$$IR0' = 0.075 \text{ [mA]} + Ibias0' = 1.315 \text{ [mA]} \quad (5)$$

$$IW' = 1.315 \times 6 = 7.89 \text{ [mA]} \quad (6)$$

FIG. 24 shows a case where four banks each having a memory cell array constitution of 8 rows×32 columns are provided in the row direction without layering data lines (FIG. 24A), and a case where one bank having a constitution of 8 rows×128 columns in the row direction (FIG. 24B) to schematically compare their layout occupied areas. In addition, in FIGS. 24A and 24B, peripheral circuits (peripheral circuits 1, 2) such as a driver for driving the data line and a row address decoder are arranged on both sides of each bank.

As shown in FIG. 24, when four independent banks constitute the memory array of 8 rows×128 columns (FIG. 24A), the current at the time of the programming action can be reduced, but the layout area of the peripheral circuits is increased as compared with the case of the one-bank constitution (FIG. 24B), so that the ratio in the whole memory cell array is increased and the chip size is increased.

Patent document 1: Japanese Laid-Open Patent Publication No. 2003-249629

Non-patent document 1: Y Chen et al., "An Access-Transistor-Free (0T/1R) Non-Volatile Resistance Random Access Memory (RRAM) Using a Novel Threshold Switching, Self-Rectifying Chalcogenide Device", IEDM Technical Digest, Session 37.4, 2003

DISCLOSURE OF THE INVENTION

Problems to be Solved by the Invention

As described above, when the voltage is applied to the data lines and the bit lines by the conventional ½ bias method, at the time of the programming action in the cross point-type memory cell array provided with a variable resistance element formed of metal oxide such as PCMO in a memory cell, since the bias current is generated in the non-selected memory cells receiving the bias voltage that is the half of the programming voltage, other than the programming current flowing in the selected memory cell. Thus, when the constitution of the memory cell array is large, the problem is that the number of non-selected memory cells is increased and the total current flowing in the memory cell array at the time of programming action is increased.

The present invention has been made in view of the above problems and it is an object of the present invention to reduce a current at the time of programming action in a semiconductor memory device having a cross point-type memory cell array provided with a memory cell comprising a variable resistance element storing information by a change of electric resistance.

Means for Solving the Problems

A semiconductor memory device according to the present invention to attain the above object comprises memory cell arrays arranged at least in a row direction, the memory cell arrays each including a plurality of memory cells arranged in a row direction and a column direction, the memory cells each having a variable resistance element for storing information by a change of an electric resistance, a plurality of data lines extending in the row direction, and a plurality of bit lines extending in the column direction, in which one end of the variable resistance element of each of the memory cells in the same row is connected to a common data line and the other end of the variable resistance element of each of the memory cells in the same column is connected to a common bit line, and it is characterized as first characteristics in that a plurality of main data lines for supplying a predetermined data line voltage to each of the corresponding data lines of the memory cell arrays arranged in the row direction extend in the row direction, the main data lines are connected to the corresponding data lines through respective data line selection transistors in the memory cell array, and the number of the data lines of the memory cell array is equal to the maximum number of the memory cells to be programmed simultaneously in one programming action.

According to the semiconductor memory device having the first characteristics, in the so-called cross point-type memory cell array in which the plurality of memory cells having the variable resistance element for storing information by the change of the electric resistance are arranged in a row direction and a column direction, a plurality of data lines extending in the row direction and a plurality of bit lines extending in the column direction are provided, and one ends of the variable resistance elements of the memory cells in the same row are connected to the common data line, and the other ends of the variable resistance elements of the memory cells in the same column are connected to the common bit line, the number of columns constituting the memory cell array is reduced and a memory cell array size can be reduced without increasing an area required for peripheral circuits such as a driver circuit and a decoder circuit for driving and selecting the data line, respectively. As a result, when the programming action is performed to the memory cell to be programmed in the one memory cell array, since the number of non-selected memory cells receiving a bias voltage insufficient for the programming can be reduced in the memory cell array to be programmed, a total bias current flowing in the non-selected memory cells due to the application of the bias voltage can be reduced, so that a current value flowing in the whole memory cell array due to the programming action can be reduced.

In addition, since the number of rows (the number of data lines) constituting each memory cell array is equal to the maximum number of the memory cells to be programmed at the same time in one programming action, that is, a programming data width when one-bit memory cell is assumed, there is no non-selected data lines exceeding the programming data width at the time of programming action, the excess bias current flowing in the non-selected memory cells connected to the non-selected data lines can be reduced and furthermore, the current value flowing in the whole memory cell array due to the programming action can be reduced. Especially, when the voltage applying method, for example, the voltage applying method employed in the semiconductor memory device having the seventeenth or eighteenth characteristics is used instead of the conventional ½ bias method, and the non-selected memory cells receiving the bias voltage is set on the non-selected data lines, since the number of the non-selected data lines can be reduced, the total of the bias current at the time of programming action can be further reduced, so that the current value flowing in the whole memory cell array at the time of programming action can be reduced.

The semiconductor memory device having the first characteristics is characterized as second characteristics in that the number of the bit lines is equal to that of the data lines in the memory cell array.

According to the semiconductor memory device having the second characteristics, a total length of the data line and the bit line can be minimized in the same memory array size, so that the electric characteristics at the time of programming action and reading action can be improved. Furthermore, the programming data or the reading data can be constituted in either row direction or column direction in the memory cell array.

Furthermore, the semiconductor memory device having the above first or second characteristics is characterized as third characteristics in that circuitry for supplying a predetermined data line voltage to the main data lines is arranged separately on both outer sides of the memory cell arrays arranged in the row direction.

Furthermore, the semiconductor memory device having the third characteristics is characterized as fourth characteristics in that circuitry for supplying the predetermined data line voltage to the odd-numbered main data lines is arranged on one outer side of the memory cell arrays arranged in the row direction and circuitry for supplying the predetermined data line voltage to the even-numbered main data lines is arranged on the other outer side of the memory cell arrays arranged in the row direction.

According to the semiconductor memory device having the above third or fourth characteristics, since the peripheral circuits such as the driver circuit for supplying the predetermined data line voltage to each main data line and the decoder circuit are arranged without being limited by a wiring interval of the main data line, the occupied area of the peripheral circuits can be appropriately adjusted.

Furthermore, the semiconductor memory device having any one of the above characteristics is characterized as fifth characteristics in that the memory cell arrays are arranged in the row direction and column direction, a plurality of main bit lines for supplying a predetermined bit line voltage to each of the corresponding bit lines of the memory cell arrays arranged in the column direction extend in the column direction, and the main bit lines are connected to the corresponding bit lines through respective bit line selection transistors in the memory cell array.

According to the semiconductor memory device having the fifth characteristics, since the memory cell arrays are arranged in the column direction also, even when the number of the data lines of the memory cell array is limited to the maximum number of memory cells to be simultaneously programmed at the time of programming action, the number of the data lines in the whole memory cell array can be increased, so that capacity can be easily increased while the current at the time of programming action is suppressed.

Furthermore, the semiconductor memory device having the fifth characteristics is characterized as sixth characteristics in that in the case where the number of bit lines and the number of data lines are the same in the memory cell array, when a maximum current flowing in the data lines and the bit lines in a programming action is a current flowing in the data lines, a current driving ability of the data line selection transistor is set to be greater than that of the bit line selection transistor, and when the maximum current is a current flowing in the bit lines, a current driving ability of the bit line selection transistor is set to be grater than that of the data line selection transistor.

According to the semiconductor memory device having the sixth characteristics, since the current driving abilities of the data line selection transistor and the bit line selection transistor can be appropriately set depending on the amount of the current flowing in the data line and the bit line, when the memory cell array comprises the variable resistance element whose electric resistance is changed by application of an electric stress, each memory cell array can be so constituted that a programming current required in the memory cell to be programmed can be supplied at the programming action.

Furthermore, the semiconductor memory device having the fifth characteristics is characterized as seventh characteristics in that the current driving ability of the bit line selection transistor is set to be greater than that of the data line selection transistor.

According to the semiconductor memory device having the seventh characteristics, in the case where the memory cell comprises the variable resistance element whose electric resistance is changed by application of the electric stress, when the current driving ability of the bit line selection transistor is set to be greater than that of the data line selection transistor, since the many memory cells to be programmed can be arranged on the same bit line, a programming current required for the plurality of selected memory cells can be supplied at the time of programming action.

Furthermore, the semiconductor memory device having the sixth or seventh characteristics is characterized as eighth characteristics in that at least one part of the transistor group having a greater current driving ability of the data line selection transistors and the bit line selection transistors is arranged under the memory cell array in a memory cell array region.

Furthermore, the semiconductor memory device having the eighth characteristics is characterized as ninth characteristics in that at least one part of the region occupied by the transistor group having a smaller current driving ability of the data line selection transistors and the bit line selection transistors is arranged outside the memory cell array region.

According to the semiconductor memory device having the eighth or ninth characteristics, since the transistor group having a greater current driving ability, that is, having a larger transistor size of the data line selection transistors and the bit line selection transistors is positively arranged on the underside of the memory cell array in the memory cell array region, the area occupied by the data line selection transistors or the bit line selection transistors arranged outside the memory cell array region can be minimized, which contributes to reduction in chip size. In addition, according to the present invention, the underside of the memory cell array is determined based on a manufacturing process order of the semiconductor memory device, that is, when the memory cell array is formed on a predetermined substrate, for example, the side of substrate is the underside of the memory cell array.

Furthermore, the semiconductor memory device having any one of the sixth to ninth characteristics is characterized as tenth characteristics in that the data line selection transistors or the bit line selection transistors having a smaller current driving ability are separated into two groups, based on the data line or the bit line and arranged in two regions that are outside the memory cell array region and face each other across the memory cell array.

According to the semiconductor memory device having the tenth characteristics, when the data line selection transistors or the bit line selection transistors are arranged outside the memory cell array region, since the transistors can be arranged without being limited by a wiring pitch of the data lines or bit lines, the transistors can be arranged with high efficiency.

Furthermore, the semiconductor memory device having any one of the fifth to tenth characteristics is characterized as eleventh characteristics in that circuitry for supplying the predetermined bit line voltage to the main bit lines is arranged separately on both outer sides in the column direction of the memory cell arrays arranged in the column direction.

Furthermore, the semiconductor memory device having the eleventh characteristics is characterized as twelfth characteristics in that circuitry for supplying the predetermined bit line voltage to the odd-numbered main bit line is arranged on one outer side in the column direction of the memory cell arrays arranged in the column direction and circuitry for supplying the predetermined bit line voltage to the even-numbered main bit line is arranged on the other outer side in the column direction of the memory cell arrays arranged in the column direction.

According to the semiconductor memory device having the above eleventh or twelfth characteristics, since the peripheral circuits such as the driver circuit for supplying the predetermined bit line voltage to each main bit line and the decoder circuit are arranged without being limited by a wiring interval of the main bit lines, the occupied area of the peripheral circuits can be appropriately adjusted.

Furthermore, the semiconductor memory device having any one of the fifth to twelfth characteristics is characterized as thirteenth characteristics in that a current driving ability of the data line selection transistor in a reading action is set to be greater than that of the bit line selection transistor, and the same reading voltage is applied to all the data lines through the data line selection transistors in the reading action in one of the memory cell arrays, so that data is read from the side of the data line.

Furthermore, the semiconductor memory device having any one of the fifth to twelfth characteristics is characterized as fourteenth characteristics in that a current driving ability of the bit line selection transistor in a reading action is set to be greater than that of the data line selection transistor, and the same reading voltage is applied to all the bit lines through the bit line selection transistors in the reading action in one of the memory cell arrays, so that data is read from the side of the bit line.

According to the semiconductor memory device having the thirteenth or fourteenth characteristics, since the current driving ability of the data line selection transistor or the bit line selection transistor to read data is set to be greater than the other, a leak current generated through the non-selected memory cells at the time of reading action, peculiar to the cross point-type memory cell array can be reduced and a reading action margin is increased, so that the reading action can be stabilized and performed at high speed.

Furthermore, the semiconductor memory device having the thirteenth or fourteenth characteristics is characterized as fifteenth characteristics in that at least one part of the transistor group having a greater current driving ability of the data line selection transistors and the bit line selection transistors is arranged on the underside of the memory cell array in the memory cell array region.

Furthermore, the semiconductor memory device having the fifteenth characteristics is characterized as sixteenth characteristics in that at least one part of the region occupied by the transistor group having a smaller current driving ability of the data line selection transistors and the bit line selection transistors is arranged outside the memory cell array region.

According to the semiconductor memory device having the fifteenth or sixteenth characteristics, since the transistor group having a greater current driving ability, that is, having a larger transistor size is positively arranged on the underside of the memory cell array in the memory cell array region, the area occupied by the data line selection transistor or the bit line selection transistor arranged outside the memory cell array region can be minimized, which contributes to reduction in chip size.

Furthermore, the semiconductor memory device having any one of the above characteristics is characterized as seventeenth characteristics in that when all the memory cells connected to one of the bit lines are simultaneously programmed at one programming action in one of the memory cell arrays, a first programming voltage is applied to all the data lines, a second programming voltage is applied to one selected bit line of the bit lines that is connected to the memory cells to be programmed, and the first programming voltage is applied to non-selected bit lines other than the selected bit line of the bit lines, in the memory cell array to be programmed.

According to the semiconductor memory device having the seventeenth characteristics, when all the memory cells connected to the one bit line are simultaneously programmed, an unnecessary bias current does not flow in the non-selected memory cells, so that the current flowing at the programming action can be minimized.

Furthermore, the semiconductor memory device having any one of the above characteristics is characterized as eighteenth characteristics in that when more than half of the memory cells connected to one of the bit lines are simultaneously programmed at one programming action in one of the memory cell arrays, a first programming voltage is applied to a selected data line of the data lines that is connected to the memory cells to be programmed, a second programming voltage is applied to one selected bit line of the bit lines that is connected to the memory cells to be programmed, a middle voltage of the first programming voltage and the second programming voltage is applied to non-selected data lines other than the selected data line of the data lines, and the first programming voltage is applied to non-selected bit lines other than the selected bit line of the bit lines, in the memory cell array to be programmed.

According to the semiconductor memory device having the eighteenth characteristics, when more than the half of all the memory cells connected to the one bit line are simultaneously programmed, the voltage is applied to each data line and bit line so that the number of non-selected data lines connected to the memory cells not to be simultaneously programmed is less than the half of all the data lines in the memory cell array to be programmed, and the bias current flows only in non-selected memory cells connected to the non-selected data lines, the total of the bias current flowing in the non-selected memory cells can be reduced as compared with that by the conventional ½ bias method, so that the current flowing at the time of programming action can be reduced.

Furthermore, the semiconductor memory device having any one of the first to seventeenth characteristics is characterized as nineteenth characteristics in that when less than half of the memory cells connected to one of the bit lines are simultaneously programmed at one programming action in one of the memory cell arrays, a first programming voltage is applied to a selected data line of the data lines that is connected to the memory cells to be programmed, a second programming voltage is applied to one selected bit line of the bit lines that is connected to the memory cells to be programmed, a middle voltage of the first programming voltage and the second programming voltage is applied to non-selected data lines other than the selected data line of the data lines, and the middle programming voltage is applied to non-selected bit lines other than the selected bit line of the bit lines, in the memory cell array to be programmed.

According to the semiconductor memory device having the nineteenth characteristics, when less than the half of all the memory cells connected to the one bit line are simultaneously programmed, the voltage is applied to each data line and bit line so that the number of selected data line connected to the memory cells to be simultaneously programmed is less than the half of all the data lines in the memory cell array to be programmed, and the bias current flows only in non-selected memory cells connected to the selected data line and in the non-selected memory cells on the same bit line as the selected memory cell, the total of the bias current flowing in the non-selected memory cells can be reduced to be lower than the current flowing when the half of all the memory cells connected to one bit line are simultaneously programmed by the conventional ½ bias method. That is, according to the conventional ½ bias method, as the number of memory cells to be simultaneously programmed in all the memory cells connected to one bit line is increased, the number of non-selected memory cells in which the bias current flows is increased, so that when the conventional ½ bias method is limited to the case where less than half of all the memory cells connected to one bit line is simultaneously programmed, the current flowing at the time of programming action can be reduced.

Furthermore, the semiconductor memory device having any one of the above characteristics is characterized as twentieth characteristics in that when all the memory cells connected to one of the bit lines are simultaneously reset at one programming action in one of the memory cell arrays, a first reset voltage is applied to all the data lines, a second reset voltage is applied to one selected bit line of the bit lines that is connected to the memory cells to be reset, and the first reset voltage is applied to non-selected bit lines other than the selected bit line of the bit lines, in the memory cell array to be reset.

According to the semiconductor memory device having the twentieth characteristics, when all the memory cells connected to the one bit line are simultaneously reset, an unnecessary bias current does not flow in the non-selected memory cells, so that the current flowing at the time of the reset action can be minimized.

EXPLANATION OF REFERENCES

Figure 1:
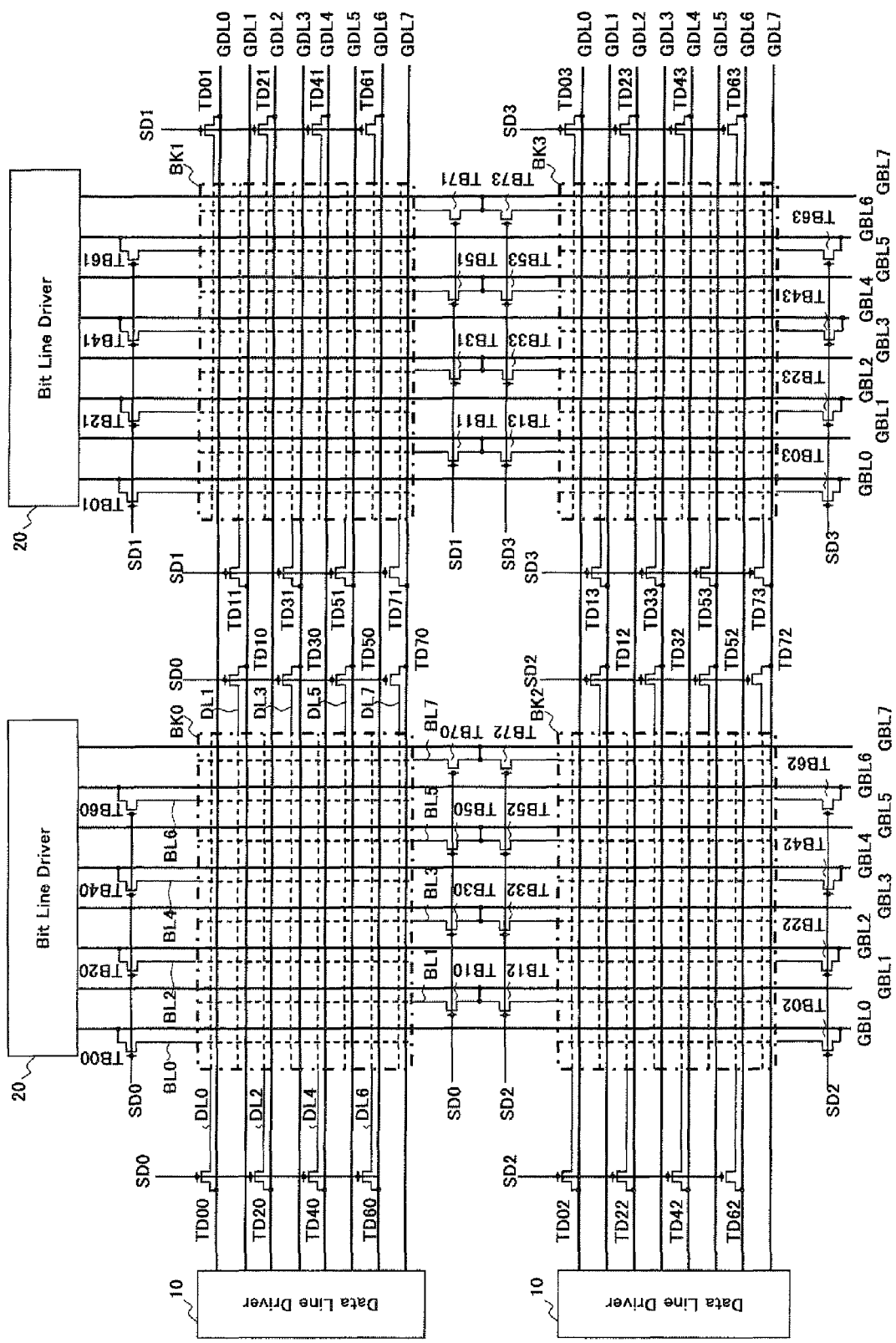
FIG. 1 is a circuit block diagram schematically showing one example of a block constitution of a memory cell array in a semiconductor memory device according to the present invention.

10: Data line driver
11: Row decoder
20: Bit line driver
21: Column decoder
30: Row voltage displacement suppression circuit
31: Column voltage displacement suppression circuit
Am: Memory cell array region
Ab1, Ab2 Arranged region of bit line selection transistor
Ad1, Ad2: Arranged region of data line selection transistor
BKk (k=0 to 3): Memory cell array (bank)
BLj (j=0 to 7): Bit line
DLi (i=0 to 7): Data line
GBLj (j=0 to 7): Main bit line
GDLi (i=0 to 7): Main data line
P0, P1: Load transistor
SDk (k=0 to 3): Bank selection line TBjk (j=0 to 7, k=0 to 3): Bit line selection transistor
TDik (i=0 to 7, k=0 to 3): Data line selection transistor
Vw: Programming voltage (first programming voltage)
Ve: Reset voltage (second reset voltage)
Vr1: First reading voltage
Vr2: Second reading voltage
Vm0, Vm1: Voltages of main data lines GDL0, GDL1
Vd0, Vd1: Voltages of data lines DL0, DL1

BEST MODE FOR CARRYING OUT THE INVENTION

One embodiment of a semiconductor memory device according to the present invention (referred to as the "device of the present invention", hereinafter) will be described with reference to the drawings.

First Embodiment

Figure 2:
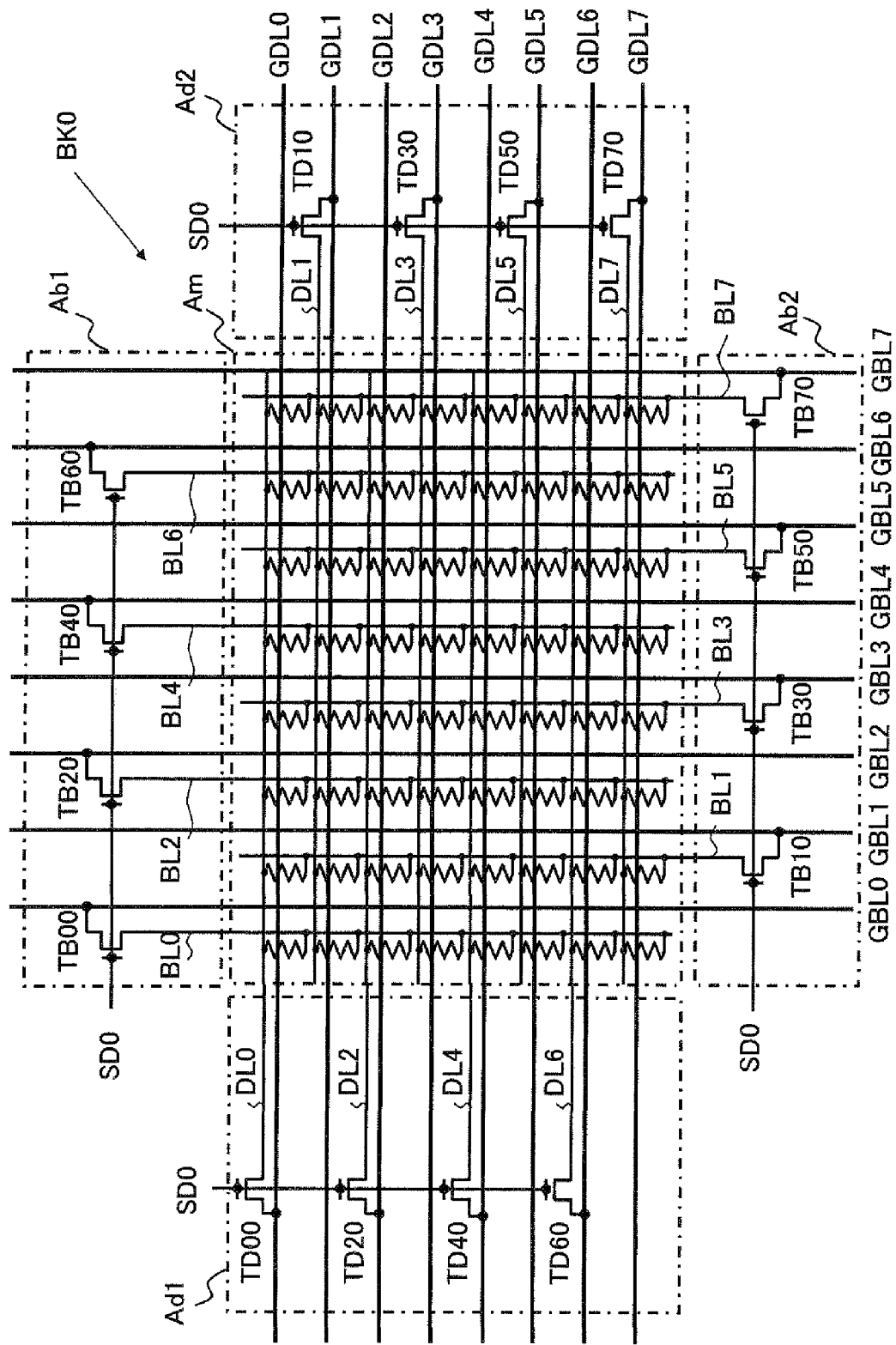
FIG. 2 is a circuit block diagram showing a specific constitution example of the memory cell array of the semiconductor memory device according to the present invention shown in FIG. 1.

FIG. 1 shows a block constitution of a memory cell array of the device of the present invention that is a cross point memory employing a multi-bank system. As shown in FIG. 2, each bank BKk (k=0 to 3) has a cross point-type memory cell array structure including a plurality of memory cell arrays in which memory cells each configured by a variable resistance element storing information by a change of an electric resistance are arranged in a row direction and a column direction, a plurality of data lines DLi extending in the row direction and a plurality of bit lines BLj extending in the column direction are provided, one ends of the variable resistance elements are connected to the common data lines in each of the memory cells in the same row, and the other ends of the variable resistance elements are connected to the common bit lines in each of the memory cells in the same column. In addition, in FIG. 1, the data lines DLi and the bit lines BLj of each bank BKk are shown by broken lines simply and the memory cell is not shown. Furthermore, the memory cell array of the multi-bank system is provided by arranging a plurality of banks having the cross point-type memory cell array structure in the row direction and the column direction in the shape of matrix. Although the banks BKk are arranged in 2 rows×2 columns in the shape of matrix in FIG. 1 for simplifying the description, the arrangement of the banks are not limited to the 2 rows×2 columns. In addition, FIG. 2 shows the memory cell array constitution in one bank shown in FIG. 1 in detail and each bank BKk has an array size of 8 rows×8 columns, for example for simplifying the description, in which 8 data lines DLi and 8 bit lines BLj are provided. In addition, "i" of the data line DLi is a data line number and "j" of the bit line BLj is a bit line number, and each of them corresponds to 0 to 7 in this embodiment.

According to the multi-bank system in this embodiment, the number of main data lines GDLi connected the banks arranged in the same row is the same as the number of the data lines DLi (eight) in each bank, which is eight in the example shown in FIG. 1. In addition, the number of main bit lines GBLj connected the banks arranged in the same column is the same as the number of the bit lines BLi (eight) in each bank, which is eight in the example shown in FIG. 1. In addition, 'I' of the main data line GDLi is a main data line number that corresponds to the data line number "i" of the data line DLi, and "j" of the main bit line GBLj is a main bit line number that corresponds to the bit line number "j" of the bit line BLj.

In addition, as shown in FIG. 1, in each of the banks BLk (k=0 to 3), each main data line GDLi and each data line DLi are connected through a data line selection transistor TDik corresponding to a bank selection transistor on the side of the row, and each main bit line GBLj and each bit line BLj are connected through a bit line selection transistor TBjk corresponding to a bank selection transistor on the side of the column. More specifically, in the bank BK0, for example, the main data lines GDLi (i=0 to 7) are connected to the data lines DLi (i=0 to 7) through the corresponding data line selection transistors TDi0 (i=0 to 7), respectively and similarly, the main bit lines GBLj (j=0 to 7) are connected to the bit lines BLj (j=0 to 7) through the corresponding bit line selection transistors TBj0 (j=0 to 7), respectively. The same is true in other banks BK1 to BK3.

Furthermore, each main data line GDLi is connected to a data line driver 10 for driving each main data line GDLi and supplying a predetermined data line voltage thereto, and each main bit line GBLj is connected to a bit line driver 20 for driving each main bit line GBLj and supplying a predetermined bit line voltage thereto.

The data line selection transistor TDik has both functions to select the bank BKk and connect each main data line GDLi to the corresponding data line DLi in each bank BKk. Similarly, the bit line selection transistor TBjk has both functions to select the bank BKk and to connect each main bit line GBLj to the corresponding bit line BLj in each bank BKk. In addition, a bank selection line SDk is inputted to each gate of the data line selection transistor TDik (i=0 to 7) and the bit line selection transistor TBjk (j=0 to 7). The bank selection line SDk is provided for each bank BKk and the selected bank is to be only controlled as described above.

In addition, according to this embodiment, the data line selection transistors TDik (i=0, 2, 4, 6) corresponding to the even-numbered data lines DLi and the data line selection transistors TDik (i=1, 3, 5, 7) corresponding to the odd-numbered data lines DLi are separated in the row direction, and the bit line selection transistors TBjk (j=0, 2, 4, 6) corresponding to the even-numbered bit lines BLj and the bit line selection transistors TBjk (j=1, 3, 5, 7) corresponding to the odd-numbered bit lines BLj are separated in the column direction. In addition, the data line selection transistor TDik and the bit line selection transistor TBjk shown in FIGS. 1 and 2 are equivalent circuits in view of electric connection relation, which do not correspond to actual circuit layouts.

Next, a description will be made of a programming action and a reset action of the bank BK0 of the device of the present invention with reference to FIGS. 3 to 8. Since the same is true in the other banks BK1 to BK3, their description will be omitted. In addition, the data line selection transistor TDik and the bit line selection transistor TBjk in the memory cell array shown in FIG. 2 are not shown in FIGS. 3 to 8.

According to this embodiment, it is assumed that a data width of programming data is 8 bits and each memory cell is a binary memory cell storing one bit. Here, the data width is equal to the maximum number "8" of the memory cells that are programmed at the same time. In addition, when a reset state is "0" and a programmed state is "1" in each bit of the 8-bit data, only the memory cell corresponding to the bit "1" in the programming data is to be programmed. In addition, the "0" and "1" of the reset state and the programmed state may be reversed. Hereinafter, the description will be made assuming that the programmed state is "1".

Figure 3:
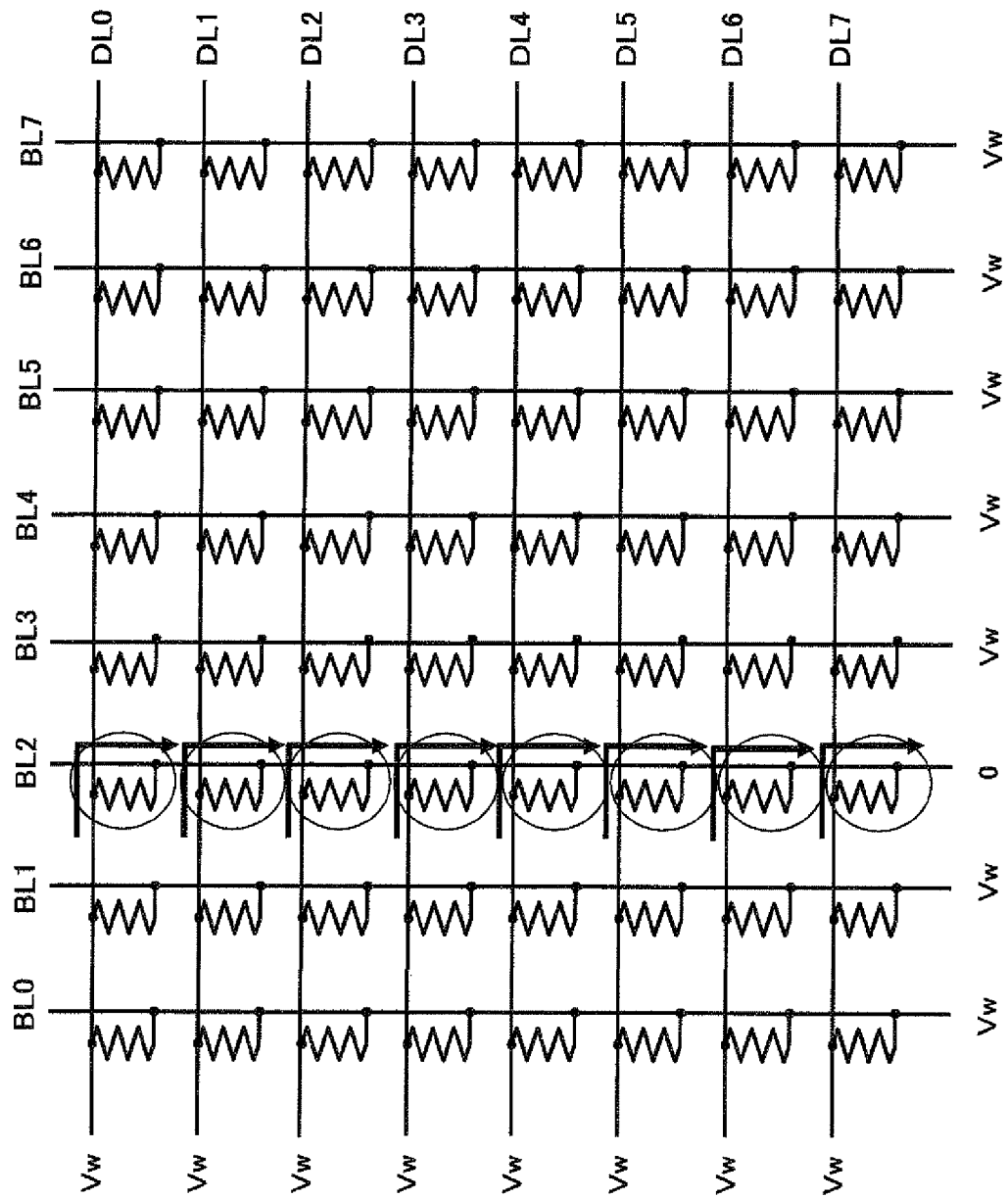
FIG. 3 is a circuit diagram of a memory cell array to explain one example of a programming action of the memory cell array of the semiconductor memory device according to the present invention.

FIG. 3 shows a voltage applied to each data line DLi (i=0 to 7) and each bit line BLj (j=0 to 7) in a case where 8-bit data "11111111" is programmed in the eight memory cells connected to the bit line BL2 in the same column. According to the example shown in FIG. 3, all the data lines DLi (i=0 to 7) are the selected data lines and the bit line BL2 is the selected bit line. In addition, in FIG. 3, the memory cells to be programmed are enclosed with circles to be discriminated from non-selected memory cells not to be programmed. As shown in FIG. 3, a programming voltage Vw (corresponding to a first programming voltage) is applied to all the data lines DLi (i=0 to 7) and 0[V] (corresponding to a second programming voltage) is applied to the selected bit line BL2 and the programming voltage Vw (corresponding to the first programming voltage) is applied to the non-selected bit lines BLj (j≠2) other than the selected bit line BL2 at the same time.

As a result, the programming voltage Vw is applied only to the eight selected memory cells enclosed with circles and connected to the bit line BL2 in the same column, so that the programming action is performed on those memory cells. In addition, according to this embodiment, since the same programming voltage Vw is applied to both ends of the non-selected memory cells, a bias voltage applied to the non-selected memory cells is 0[V], so that a bias current does not flow. According to the example shown in FIG. 3, a programming current (shown by a solid line arrow) flows only in the selected memory cells.

Figure 4:
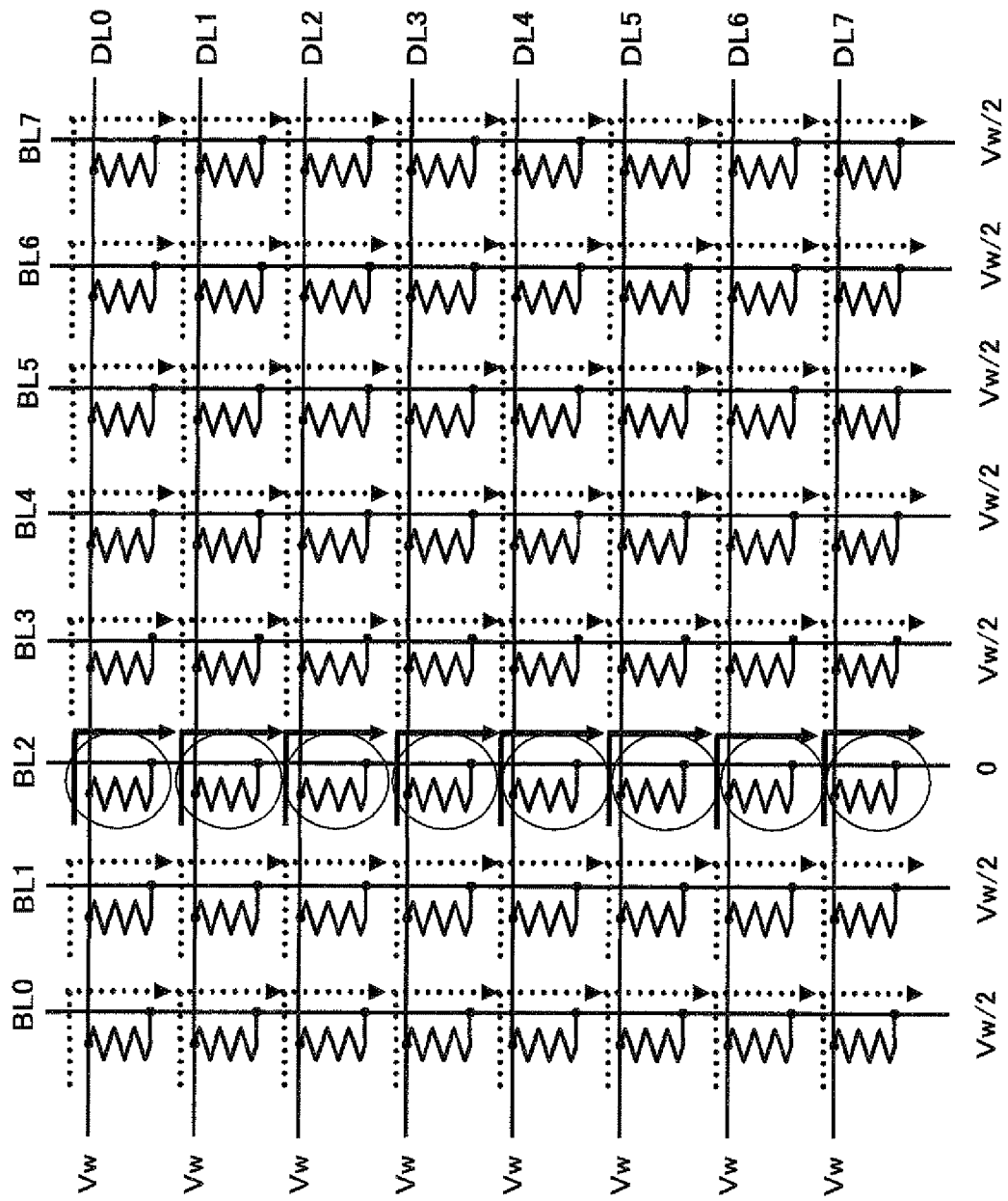
FIG. 4 is a circuit diagram showing a memory cell array to explain one example of a programming action of a memory cell array according to a conventional ½ bias method.

Meanwhile, FIG. 4 shows a case where a voltage is applied to each data line DLi (i=0 to 7) and each bit line BLj (=0 to 7) by a conventional ½ bias method when the same 8-bit data "11111111" is programmed in eight memory cells connected to the bit line BL2 in the same column. As shown in FIG. 4, the programming voltage Vw is applied to all the data lines DLi (i=0 to 7) and 0[V] (the second programming voltage) is applied to the selected bit line BL2 and a middle voltage Vw/2 that is the half of the programming voltage Vw is applied to the non-selected bit lines BLj (j≠2) other than the selected bit line BL2 at the same time. As a result, the bias voltage Vw/2 (=Vw−Vw/2) is applied to all of the 56 non-selected memory cells and a bias current (shown by a broken line arrow) corresponding to the bias voltage flows in each non-selected memory cell, so that the total bias current is 56 times the bias current, and it is increased as compared with the current at the time of the programming action shown in FIG. 3. That is, the voltage applying method shown in FIG. 3 can prevent the bias current from being generated and reduce the current at the time of programming action.

Figure 5:
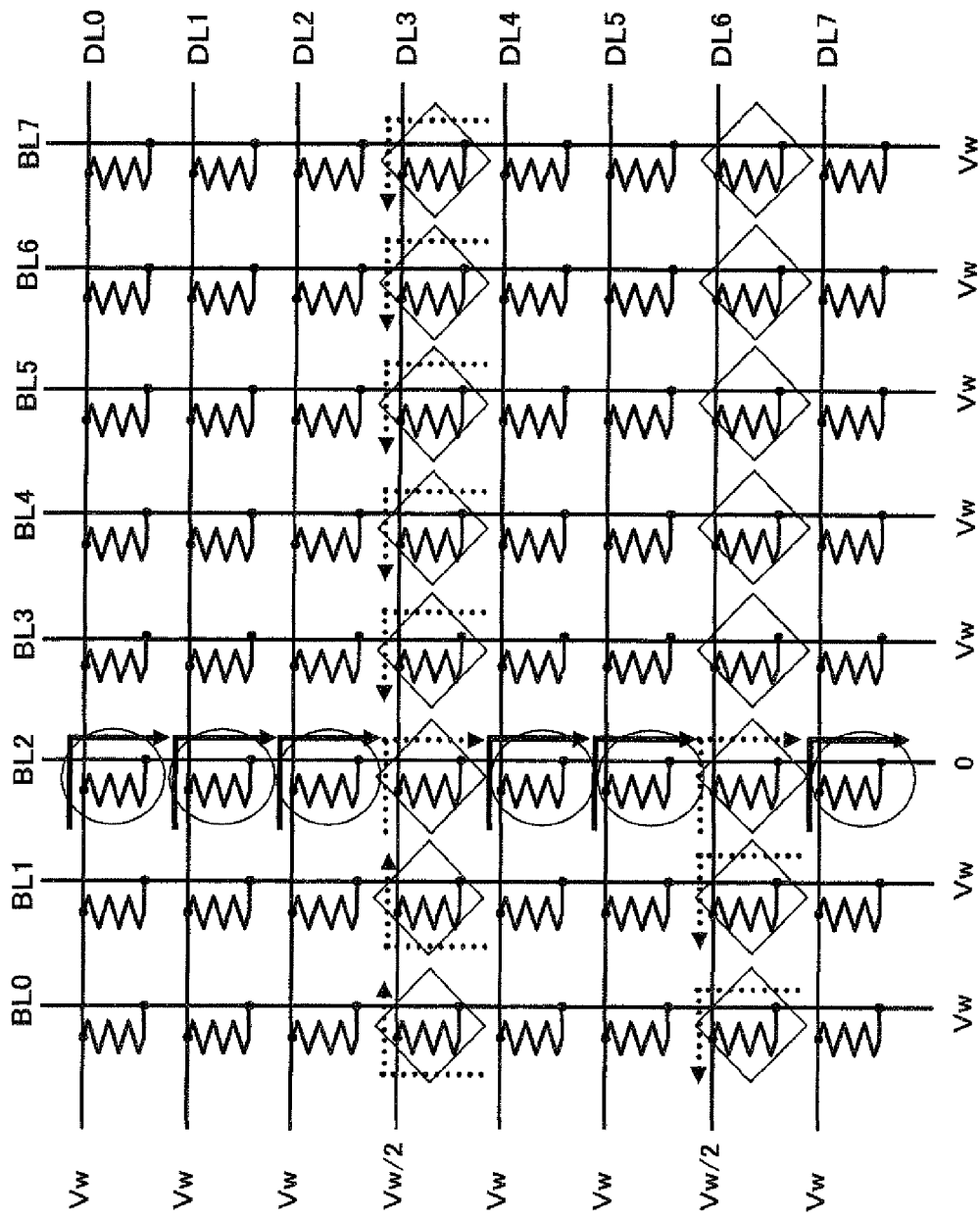
FIG. 5 is a circuit diagram of a memory cell array to explain another example of the programming action of the memory cell array of the semiconductor memory device according to the present invention.

Next, a description will be made of a programming action when more than half of eight bits are "1". FIG. 5 shows a voltage applied to each data line DLi (i=0 to 7) and each bit line BLj (j=0 to 7) when 8-bit data "10110111" (the case where more than half of eight bits are "1") is programmed in the eight memory cells connected to the bit line BL2 in the same column. The data lines DL0 to DL7 correspond to eight bits of the data from a lower bit to higher bit, respectively. According to the example shown in FIG. 5, the data lines DLi (i=0, 1, 2, 4, 5, 7) are the selected data lines and the bit line BL2 is the selected bit line. In addition, in FIG. 5, the memory cells to be programmed are enclosed with circles to be discriminated from the non-selected memory cells not to be programmed. As shown in FIG. 5, the programming voltage Vw (corresponding to the first programming voltage) is applied to the selected data lines DLi (i=0, 1, 2, 4, 5, 7), 0[V] (corresponding to the second programming voltage) is applied to the selected bit line BL2, the middle voltage Vw/2 (corresponding to the middle voltage between the first programming voltage and the second programming voltage) that is the half of the programming voltage Vw is applied to the non-selected data lines DLi (i=3, 6), and the programming voltage Vw (corresponding to the first programming voltage) is applied to the non-selected bit lines BLj (j≠2) other than the selected bit line BL2 at the same time.

As a result, the programming voltage Vw is only applied to the six selected memory cells enclosed with circles and connected to the bit line BL2 in the same column so that the data is programmed in those memory cells. In addition, the bias voltage Vw/2 (=Vw−Vw/2) is applied to eight non-selected memory cells enclosed with rhombuses and connected to the non-selected data lines DLi (i=3, 6) so that the programming is not performed in each non-selected memory cell, but a bias current (shown by a broken line arrow) corresponding to the bias voltage flows in each non-selected memory cell, so that the total bias current which is 16 times the bias current flows in addition to the programming current (shown by a solid line arrow) flowing in the selected memory cells.

Figure 6:
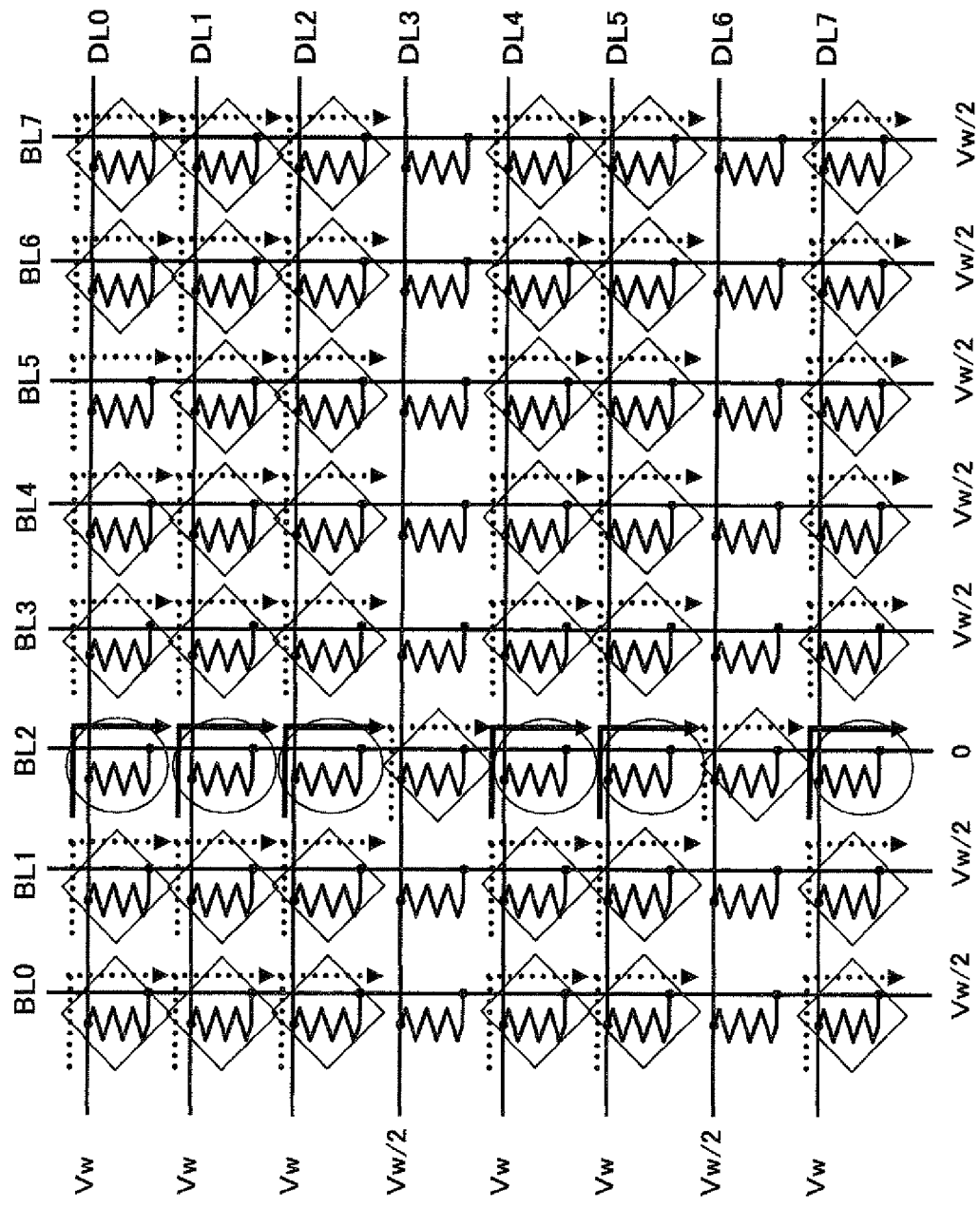
FIG. 6 is a circuit diagram showing a memory cell array to explain another example of the programming action of a memory cell array according to a conventional ½ bias method.

Meanwhile, FIG. 6 shows a case where a voltage is applied to each data line DLi (i=0 to 7) and each bit line BLj (j=0 to 7) by a conventional ½ bias method when the same 8-bit data "10110111" is programmed in eight memory cells connected to the bit line BL2 in the same column. As shown in FIG. 6, the programming voltage Vw is applied to the selected data lines DLi (i=0, 1, 2, 4, 5, 7), 0[V] is applied to the selected bit line BL2, the middle voltage Vw/2 that is the half of the programming voltage Vw is applied to the non-selected data lines DLi (i=3, 6), and the middle voltage Vw/2 that is the half of the programming voltage Vw is applied to the non-selected bit lines BLj (j≠2) other than the selected bit line BL2 at the same time. As a result, the bias voltage Vw/2 (=Vw−Vw/2) is applied to the 44 non-selected memory cells enclosed with rhombuses and a bias current (shown by a broken line arrow) corresponding to the bias voltage flows in each non-selected memory cell, so that the total bias current which is 44 times the bias current flows. This total bias current is 44 times the bias current per unit and it is increased as compared with the total bias current (16 times the bias current per unit flowing in one non-selected memory cell) shown in FIG. 5. As a result, according to this embodiment, in the programming action of the same 8-bit data "10110111", the total bias current is reduced by a current corresponding to 28 times the bias current per unit as compared with the conventional ½ bias method, so that the programming action can be performed with a small current.

Figure 7:
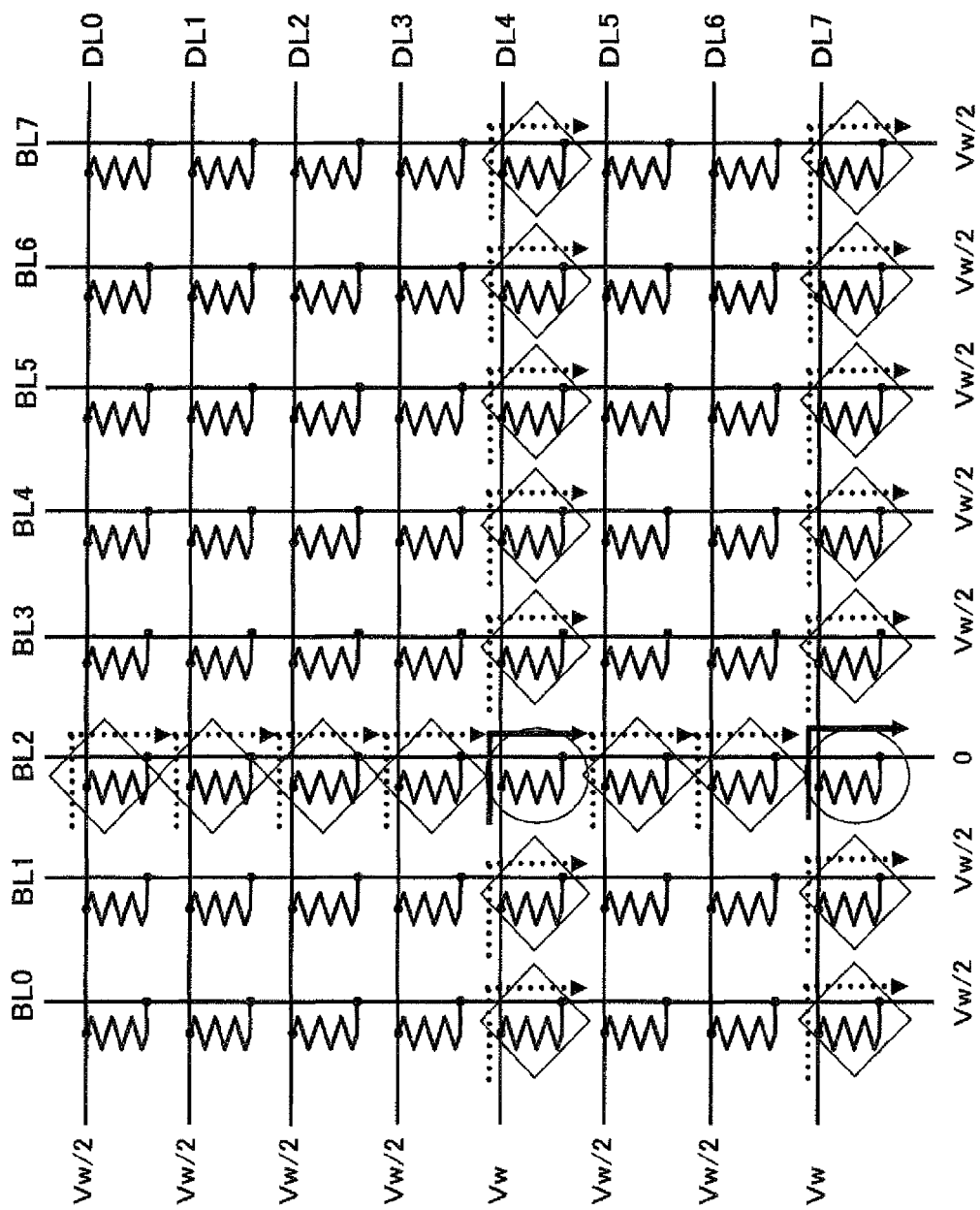
FIG. 7 is a circuit diagram of a memory cell array to explain another example of the programming action of the memory cell array of the semiconductor memory device according to the present invention.

Next, a description will be made of a programming action when less than half of eight bits is "1". FIG. 7 shows a voltage applied to each data line DLi (i=0 to 7) and each bit line BLj (j=0 to 7) when 8-bit data "10010000" (the case where less than half of eight bits is "1") is programmed in the eight memory cells connected to the bit line BL2 in the same column. The data lines DL0 to DL7 correspond to eight bits of the data from a lower bit to higher bit, respectively. According to the example shown in FIG. 7, the data lines DLi (i=4, 7) is the selected data lines and the bit line BL2 is the selected bit line. In addition, in FIG. 7, the memory cells to be programmed are enclosed with circles to be discriminated from the non-selected memory cells not to be programmed. As shown in FIG. 7, the programming voltage Vw (corresponding to the first programming voltage) is applied to the selected data lines DLi (i=4, 7), 0[V] (corresponding to the second programming voltage) is applied to the selected bit line BL2, the middle voltage Vw/2 (corresponding to the middle voltage between the first programming voltage and the second programming voltage) that is the half of the programming voltage Vw is applied to the non-selected data lines DLi (i=0, 1, 2, 3, 5, 6), and the middle voltage Vw/2 (corresponding to the middle voltage between the first programming voltage and the second programming voltage) is applied to the non-selected bit lines BLj (j≠2) other than the selected bit line BL2 at the same time.

As a result, the programming voltage Vw is only applied to the two selected memory cells enclosed with circles and connected to the bit line BL2 in the same column so that the data is programmed in those memory cells. In addition, the bias voltage Vw/2 (=Vw−Vw/2) is applied to each of seven non-selected memory cells enclosed with rhombuses and connected to the selected data lines DLi (i=4, 7) and six non-selected memory cells enclosed with rhombuses and connected to the selected bit line BL2, that is, to the 20 non-selected memory cells in total. Thus, although the programming is not performed in each non-selected memory cell, a bias current (shown by a broken line arrow) corresponding to the bias voltage flows in each non-selected memory cell, so that the total bias current which is 20 times the bias current flows in addition to the programming current (shown by a solid line arrow) flowing in the selected memory cells.

In addition, the voltage applying method shown in FIG. 7 is totally the same as the conventional ½ bias method. In the case of the conventional ½ bias method, since the bias current flows in the non-selected memory cells connected to the selected data line, as the number of "1" is increased in the data to be programmed, the number of the non-selected memory cells in which the bias current flows is increased, so that the total bias current is increased. Meanwhile, according to the voltage applying method shown in FIG. 3, since the bias current flows in the non-selected memory cells connected to the non-selected data lines, as the number of the "1" in the data to be programmed is decreased, the number of the non-selected memory cells in which the bias current flows is increased, so that the total bias current is increased. Therefore, in the case of the programming action when the number of "1" occupies more than half of the 8 bits, the conventional ½ bias method is to be employed. Thus, when the voltage (more specifically the voltage applied to the non-selected bit lines) applying method is switched depending on whether the number of "1" in the data to be programmed is more than half or less than half, the total bias current can be prevented from being increased. In addition, when the number of "1" is the half of the data to be programmed, since the total bias current in voltage applying method shown in FIG. 3 is the same as that in the conventional ½ bias method, either voltage applying method may be employed.

Figure 8:
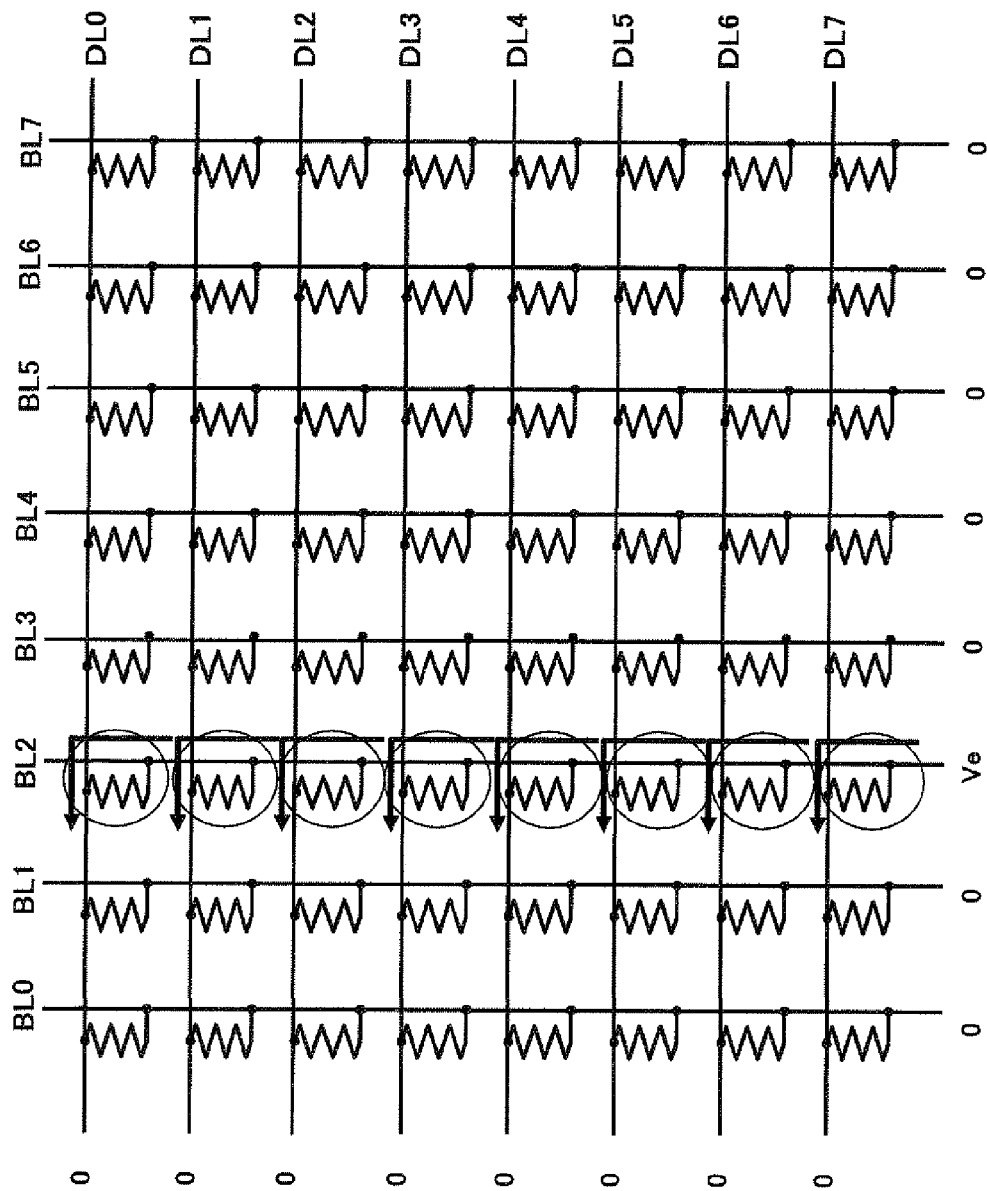
FIG. 8 is a circuit diagram of a memory cell array to explain one example of a reset action of the memory cell array of the semiconductor memory device according to the present invention.

Next, a description will be made of the reset action of the bank BK0 of the device of the present invention with reference to FIG. 8. FIG. 8 shows a voltage applied to each data line DLi (i=0 to 7) and each bit line BLj (=0 to 7) in a case where the eight memory cells connected to the bit line BL2 in the same column are reset to 8-bit data "00000000". According to the example shown in FIG. 8, all the data lines DLi (i=0 to 7) are the selected data lines and the bit line BL2 is the selected bit line. In addition, in FIG. 8, the memory cells to be programmed are enclosed with circles to be discriminated from non-selected memory cells not to be programmed. As shown in FIG. 8, 0[V] (corresponding to a first reset voltage) is applied to all the data lines DLi (i=0 to 7) and a reset voltage Ve (corresponding to a second reset voltage) is applied to the selected bit line BL2 and 0[V] (corresponding to the first reset voltage) is applied to the non-selected bit lines BLj (j≠2) other than the selected bit line BL2 at the same time.

As a result, the reset Ve is applied only to the eight selected memory cells enclosed with circles and connected to the bit line BL2 in the same column, in a direction opposite to application of the programming voltage Vw, so that the reset action is performed for those memory cells. In addition, according to this embodiment, since the same reset voltage Ve is applied to both ends of the non-selected memory cells, a bias voltage applied to the non-selected memory cells is 0[V], so that a bias current does not flow. According to the example shown in FIG. 8, a reset current (shown by a solid line arrow) flows only in the selected memory cells.

In the reset action also, similar to the programming action of the 8-bit data "11111111", the voltage applying method shown in FIG. 8 can prevent the bias current that is generated by the conventional ½ bias method and reduce the current at the time of programming action.

Next, a description will be made of the layout of the memory cell array of the device of the present invention. In addition, it is also assumed that its array size is 8 rows×8 columns in the following description.

According to this embodiment, since the memory cells connected to the same bit line are programmed with data, as for the programming current flowing in the selected memory cells to be programmed, the programming current for up to eight selected memory cells is gathered in one selected bit line BLj and flows in the corresponding selected main bit line GBLj through the bit line selection transistor TBjk. Meanwhile, the programming current flowing in the one selected memory cell connected to each selected data line DLi only flows in the selected data lines DLi. As for the bias current flowing in the non-selected memory cells, although the bias current for up to eight non-selected memory cells flows in the selected data lines or the non-selected data lines DLi, since the programming voltage applied to the selected memory cells is twice as high as the bias voltage applied to the non-selected memory cells in which the bias current flows, the current flowing in the selected bit line is larger than the current flowing in the data lines. Therefore, in order to supply the programming current sufficiently to the selected memory cells, the current supplying ability of the bit line selection transistor TBjk, that is, the transistor size is to be larger than, twice as large as, for example the current supplying ability of the data line selection transistor TDik, that is, the transistor size thereof.

Figure 9:
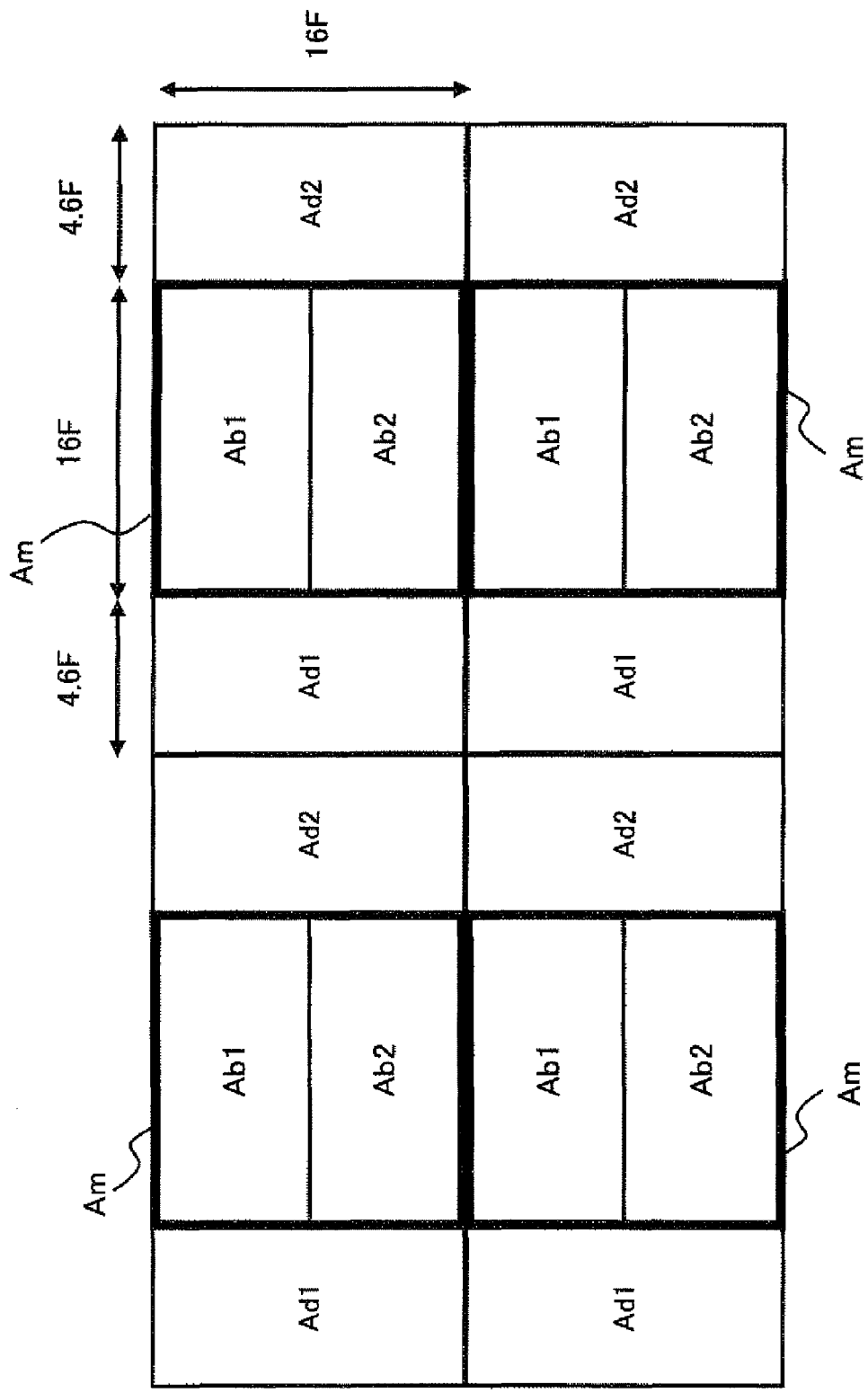
FIG. 9 is a block diagram schematically showing one example of a layout constitution of the memory cell array of the semiconductor memory device according to the present invention having the block constitution shown in FIG. 1.

FIG. 9 shows the relation between a memory cell array region (in which the memory cells are arranged in the shape of matrix) Am, regions Ad1 and Ad2 in which the even-numbered and odd-numbered data line selection transistors TDik are arranged, respectively and regions Ab1 and Ab2 in which the even-numbered and odd-numbered bit line selection transistors TBjk are arranged, respectively in each bank BKk (k=0 to 3) shown in FIG. 1. According to this embodiment, since the transistor size of the bit line selection transistor TBjk is set to be larger than the transistor size of the data line selection transistor TDik, the regions Ab1 and Ab2 of the bit line selection transistors TBjk are arranged on the underside of the memory cell array region Am. In view of a circuit layout, when the regions Ab1 and Ab2 of the bit line selection transistors TBjk having large areas overlap with the memory cell array region Am to be three-dimensionally structured, the layout area of each bank BMk can be small. In this case, the regions Ad1 and Ad2 of the data line selection transistors TDik having smaller size are arranged on both sides of the memory cell array region Am in the row direction.

Figure 10:
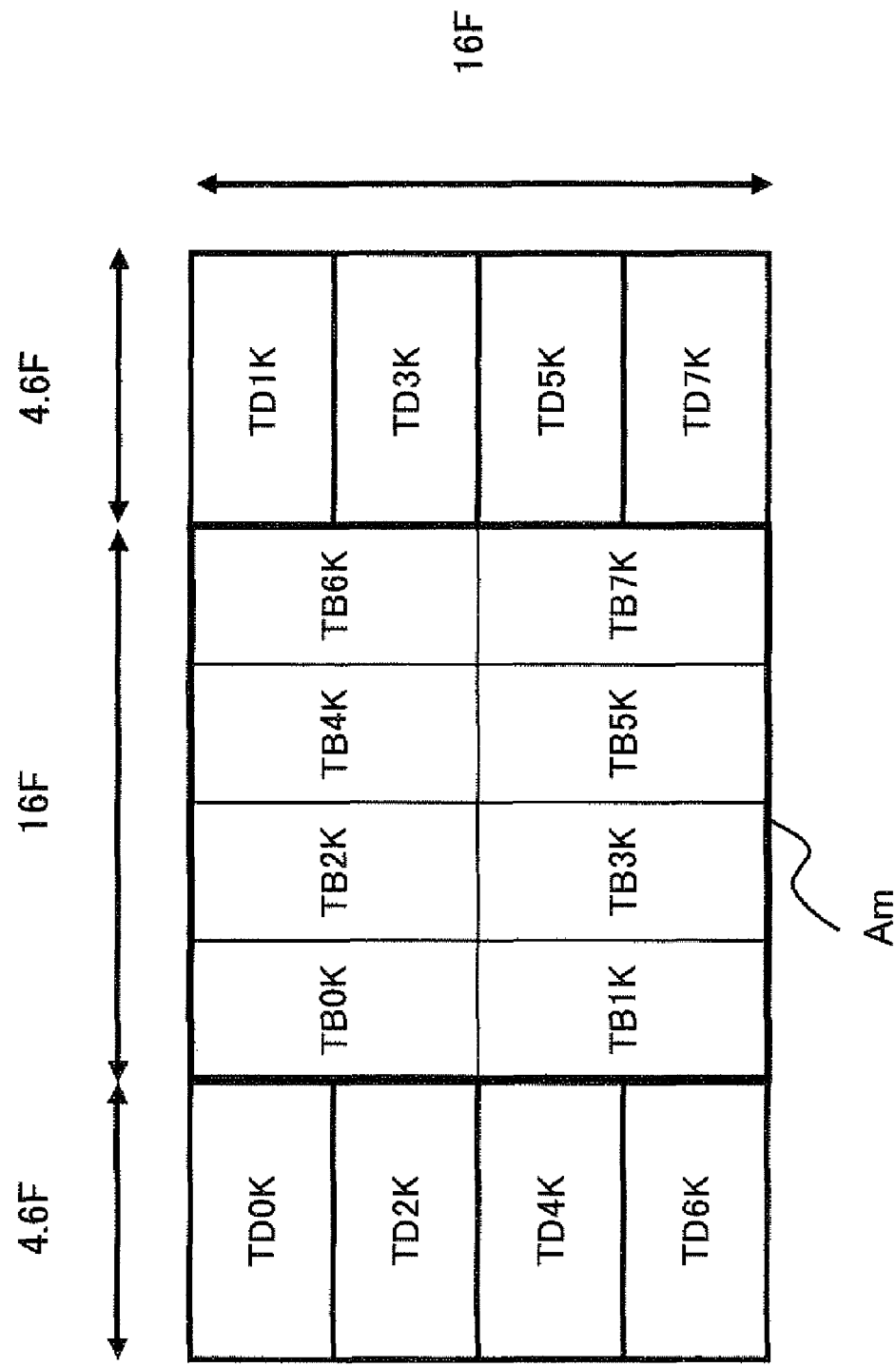
FIG. 10 is a block diagram to explain one example of a layout constitution shown in FIG. 9 with respect to each transistor.

FIG. 10 shows one example of arranged positions for the bit line selection transistors TBjk in the arranged regions Ab1 and Ab2 of the bit line selection transistors TBjk, with respect to each transistor and arranged positions for the data line selection transistor TDik in the arranged regions Ad1 and Ad of the data line selection transistors TDik, with respect to each transistor.

Next, a description will be made of the point that the eight bit line selection transistors TBjk (j=0 to 7) can be separated into two parts four by four in the column direction and contained in the memory cell array region Am having the array size of 8 rows×8 columns.

When it is assumed that a current of about 75 μA is needed for the programming action or the reset action in one memory cell, the programming current flowing in the one selected bit line in the case of the array size of 8 rows×8 columns is eight times as large as the above current, that is, 0.6 mA. In order to implement 0.6 mA as a current supplying ability of an NMOS transistor manufactured by a general CMOS semiconductor manufacturing process, when a semiconductor manufacturing process whose minimum processing dimension F is 0.13 μm is used, a gate width of about 1 μm is needed. The gate width corresponds to about 7.69 times (about 7.69F) as large as the minimum processing dimension F. Meanwhile, since each of both line widths and wiring space of the data line DLi and bit line BLi is the minimum processing dimension F, the size of the memory cell array region Am is 16F×16F, so that the two bit line selection transistors TBjk can be arranged in the column direction in the length 16F of the memory cell array region Am in the column direction. In addition, the bit line selection transistors TBjk are arranged at an interval of 4F in the gate length direction.

Next, a consideration is given to an area needed to each of the arranged regions Ad1 and Ad2 of the data line selection transistors TDik. A maximum current of the data line DLi is the sum of the bias current flowing in the seven non-selected memory cells to which the bias voltage that is the half of the programming voltage is applied, and the programming current flowing in the one selected memory cell to which the programming voltage is applied. When it is assumed that the bias voltage is 2V and each resistance value R of the non-selected memory cells is a low resistance value of 50 kΩ, since the bias current of each non-selected memory cell is 40 μA, a maximum current Idl of the data line DLi is 0.355 mA as expressed by the following equation (7).

$$Idl = 0.04 \times 7 + 0.075 = 0.355 \text{ [mA]} \tag{7}$$

In order to implement 0.355 mA as a current supplying ability of an NMOS transistor manufactured by a general CMOS semiconductor manufacturing process, when a semiconductor manufacturing process whose minimum processing dimension F is 0.13 μm is used, a gate width of about 0.6 μm is needed. The gate width corresponds to about 4.6 times (about 4.6F) as large as the minimum processing dimension F. In addition, the data line selection transistors TDik are arranged at an interval of 4F in the gate length direction.

Next, a description will be briefly made of the point that the 16 bit line selection transistors TBjk (j=0 to 15) can be separated into two parts, eight by eight, in the column direction and contained in the memory cell array region Am having an array size of 16 rows×16 columns similar to the case of the array size of 8 rows×8 columns.

When it is assumed that a current of about 75 μA is needed for the programming action or the reset action in one memory cell, the programming current flowing in the one selected bit line in the case of the array size of 16 rows×16 columns is 16 times as large as the above current, that is, 1.2 mA. In order to implement 1.2 mA as the current supplying ability of the NMOS transistor manufactured by a general CMOS semiconductor manufacturing process, when a semiconductor manufacturing process whose minimum processing dimension F is 0.13 μm is used, a gate width of about 2 μm is needed. The gate width corresponds to about 15.38 times (about 15.38F) as large as the minimum processing dimension F. Meanwhile, since each of both line width and wiring space of the data line DLj and bit line BLj is the minimum processing dimension F, the size of the memory cell array region Am is 32F×32F, so that the two bit line selection transistors TBjk can be arranged in the column direction in the length 32F of the memory cell array region Am in the column direction. In addition, the bit line selection transistors TBjk are arranged at an interval of 4F in the gate length direction.

Next, a consideration is given to an area needed to each of the arranged regions Ad1 and Ad2 of the data line selection transistors TDik. A maximum current of the data line DLi is the sum of the bias current flowing in the 15 non-selected memory cells to which the bias voltage that is the half of the programming voltage is applied, and the programming current flowing in the one selected memory cell to which the programming voltage is applied. When it is assumed that the bias voltage is 2V and each resistance value R of the non-selected memory cells is a low resistance value of 50 kΩ, since the bias current per each non-selected memory cell is 40 μA, a maximum current Idl' of the data line DLi is 0.675 mA as expressed by the following equation (8).

$$Idl' = 0.04 \times 15 + 0.075 = 0.675 \text{ [mA]} \tag{8}$$

In order to implement 0.675 mA as a current supplying ability of an NMOS transistor manufactured by a general CMOS semiconductor manufacturing process, when a semiconductor manufacturing process whose minimum processing dimension F is 0.13 μm is used, a gate width of about 1.13 μm is needed. The gate width corresponds to about 8.7 times (about 8.7F) as large as the minimum processing dimension F. In addition, the data line selection transistors TDik are arranged at an interval of 4F in the gate length direction.

Figure 11:
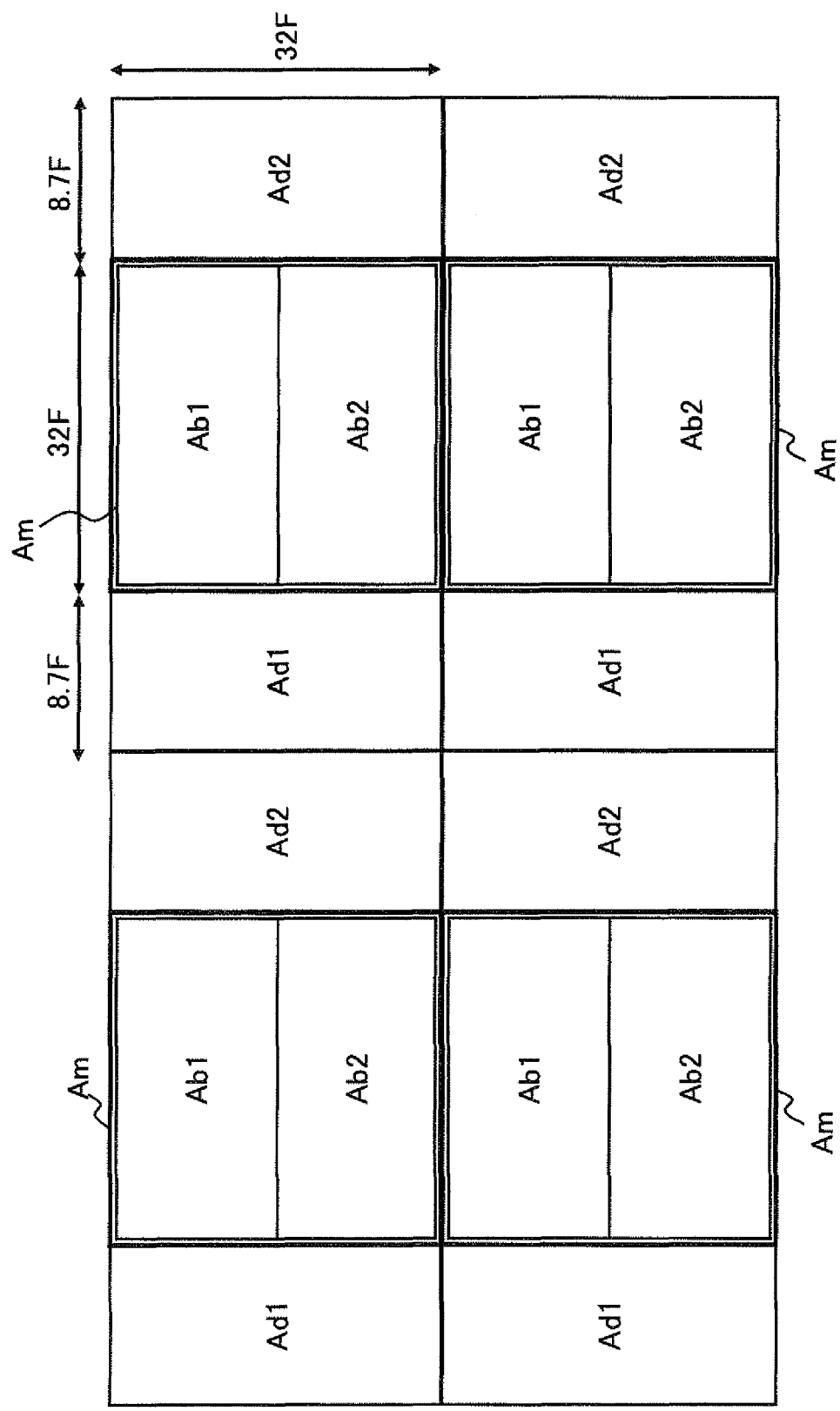
FIG. 11 is a block diagram schematically showing one example of a layout constitution of the memory cell array of the semiconductor memory device according to the present invention having a constitution of 16 rows×16 columns.
Figure 12:
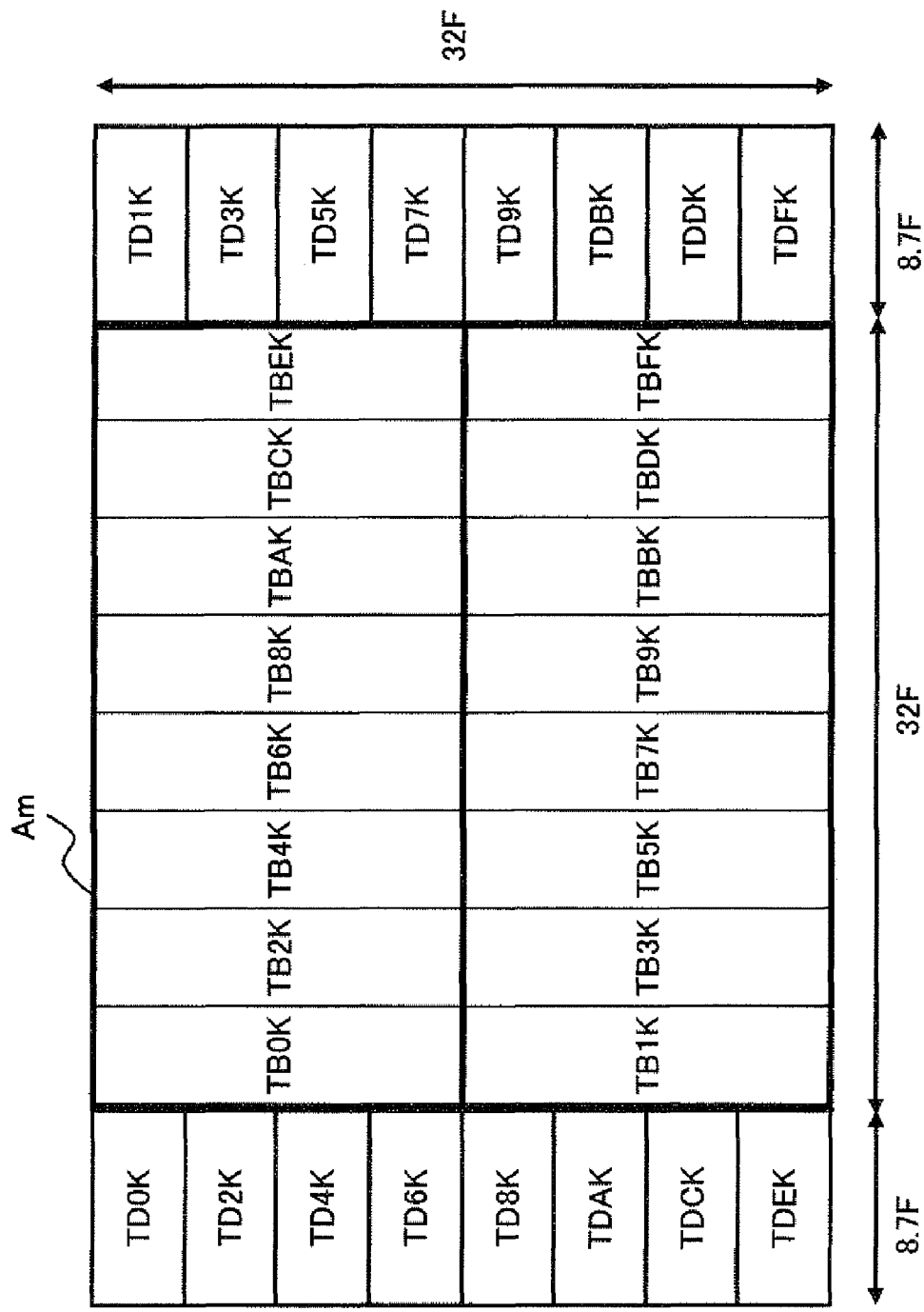
FIG. 12 is a block diagram to explain one example of the layout constitution shown in FIG. 11 with respect to each transistor.

FIG. 11 shows the relation between a memory cell array region Am, regions Ad1 and Ad2 in which the even-numbered and odd-numbered data line selection transistors TDik are arranged, respectively and regions Ab1 and Ab2 in which the even-numbered and odd-numbered bit line selection transistors TBjk are arranged, respectively in each bank BKk (k=0 to 3) having a constitution of 16 rows×16 columns. In addition, FIG. 12 shows one example of arranged positions for the bit line selection transistors TBjk (j=0 to 15) in the arranged regions Ab1 and Ab2 of the bit line selection transistors TBjk, with respect to each transistor and arranged positions for the data line selection transistors TDik (i=0 to 15) in the arranged regions Ad1 and Ad2 of the data line selection transistors TDik, with respect to each transistor.

Similarly, even when the memory cell array constitution of each bank has 32 rows×32 columns or 64 rows×64 columns, the arranged regions Ab1 and Ab2 of the even-numbered and odd-numbered bit line selection transistors TBjk having a greater current driving ability are arranged on the underside of the memory cell array region Am and the arranged regions Ad1 and Ad2 of the even-numbered and odd-numbered data line selection transistors TDik having a lower current driving ability are arranged on both sides of the memory cell array region Am in the row direction.

Meanwhile, although the semiconductor manufacturing process of 0.13 μm has been assumed in calculating the gate width of the bit line selection transistor TBjk and the gate width of the data line selection transistor TDik in the above description, when a new semiconductor manufacturing process technique is used, it is expected that the programming current (reset current) of the variable resistance element manufactured of a metal compound material is further reduced and as a result, the transistor size is also reduced and the bit line selection transistor TBjk requiring more current supply ability can be more easily arranged under the memory cell array region Am.

Next, a description will be made of a block constitution provided by increasing the capacity of the block constitution of the memory cell array using the multi-bank system, with reference to FIGS. 13 and 14.

Figure 13:
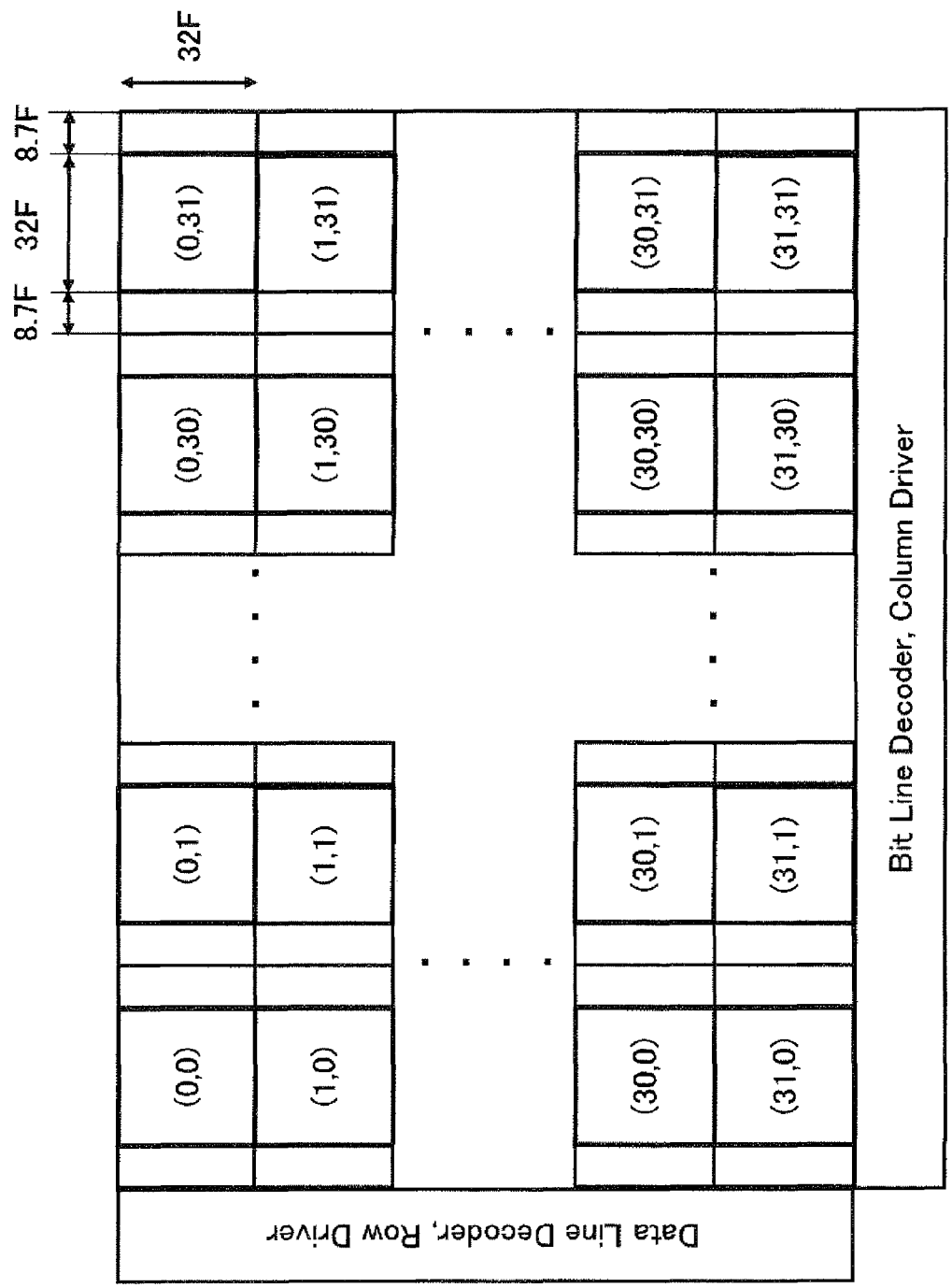
FIG. 13 is a circuit block diagram schematically showing another example of a block constitution of the memory cell array of the semiconductor memory device according to the present invention.

FIG. 13 shows a block constitution in which 32 banks each comprising a memory cell array having 16 rows×16 columns, data line selection transistors TDik (i=0 to 7), and bit line selection transistors TBj0 (j=0 to 7) are arranged in each of the row direction and the column direction. According to the block constitution shown in FIG. 19, a data line driver 10 that drives each main data line GDLi extending along the 32 banks arranged in the row direction and supplies a predetermined data line voltage and a row decoder 11 that decodes a row address and determines the selection or non-selection of each main data line GDLi are arranged on one side (left side in the drawing) of a bank array having 32 rows×32 columns in the row direction, and a bit line driver 20 that drives each main bit line GBLj extending along the 32 banks arranged in the column direction and supplies a predetermined bit line voltage and a column decoder 21 that decodes a column address and determines the selection or non-selection of each main bit line GBLj are arranged on one side (lower side in the figure) of the bank array having 32 rows×32 columns in the column direction.

According to the block constitution shown in FIG. 13, when it is assumed that the 1024 (=32×32) is one block, since one bank has 256 (–16×16) bits, memory capacity of 256K bits can be provided in the one block.

Figure 14:
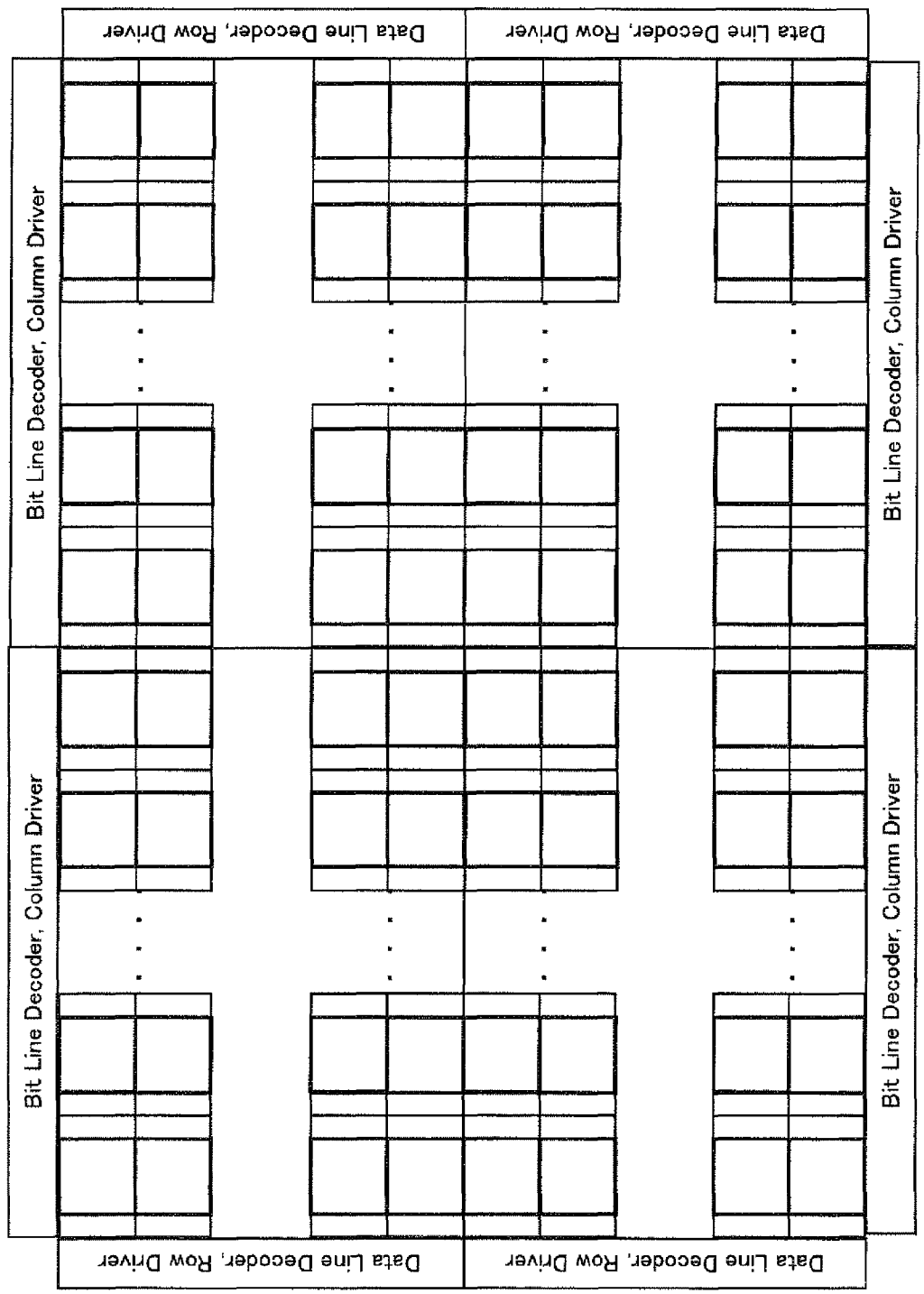
FIG. 14 is a circuit block diagram schematically showing another example of a block constitution of the memory cell array of the semiconductor memory device according to the present invention.

FIG. 14 shows a block constitution provided by arranging the four blocks each shown in FIG. 13 in 2 rows×2 columns, whereby 1M-bit memory core is formed. The capacity can be increased by arranging more cores.

Next, description will be made of another embodiment of the layout constitution of peripheral circuits such as the data line driver 10 and the bit line driver 20 in this embodiment.

Figure 15:
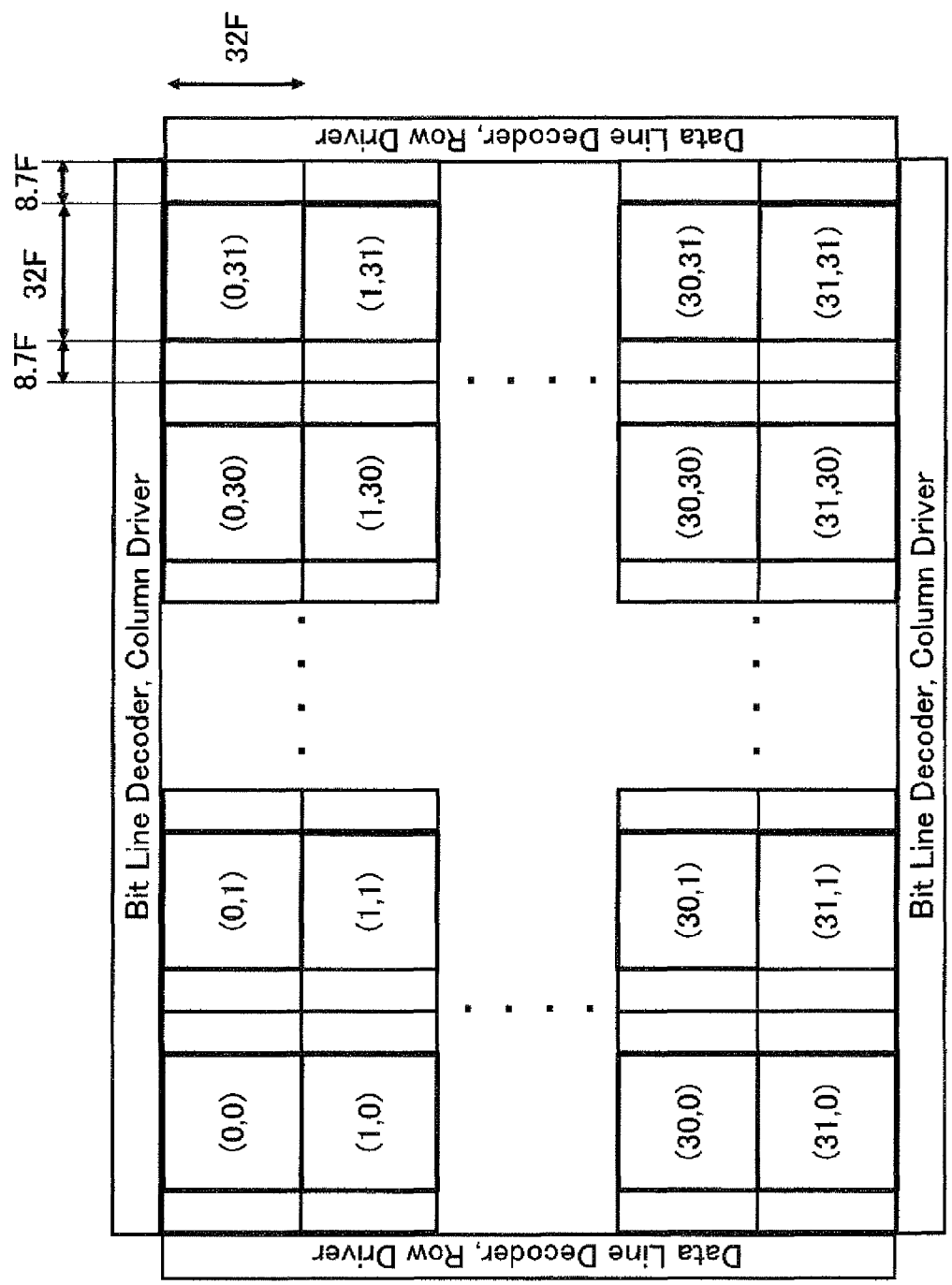
FIG. 15 is a circuit block diagram schematically showing another example of a block constitution of the memory cell array of the semiconductor memory device according to the present invention.

Although the data line driver 10 driving each main data line GDLi and the bit line driver 20 driving each main bit line GBLj are arranged on one side in the row direction and on one side in the column direction of the block comprising the banks of 2 rows×2 columns in the block constitution shown in FIG. 1, they may be arranged such that as shown in FIG. 15, a data line driver 10 driving each even-numbered main data line GDLi is arranged one side of the block in the row direction, a data line driver 10 driving each odd-numbered main data line GDLi is arranged on the other side of the block in the row direction, and a bit line driver 20 driving each even-numbered main bit line GBLj is arranged on one side of the block in the column direction and a bit line driver 20 driving each odd-numbered main bit line GBLj is arranged on the other side of the block in the column direction.

In addition, in the block constitution in which 32 banks each comprising the memory cell array having a constitution of 16 rows×16 columns are arranged in each row direction and column direction shown in FIG. 13, similarly, it may be such that a data line driver 10 driving each even-numbered main data line GDLi and a row decoder 11 are arranged on one side of the block in the row direction and a data line driver 10 driving each odd-numbered main data line GDLi and a row decoder 11 are arranged on the other side of the block in the row direction, and a bit line driver 20 driving each even-numbered main bit line GBLj and a column decoder 12 are arranged on one side of the block in the column direction and a bit line driver 20 driving each odd-numbered main bit line GBLj and a column decoder 12 are arranged on the other side of the block in the column direction.

Second Embodiment

Next, a second embodiment of the device of the present invention will be described with reference to the drawings.

According to the second embodiment, a description will be made of arrangement of a data line selection transistor TDik and a bit line selection transistor TBjk focusing on a reading action.

Figure 16:
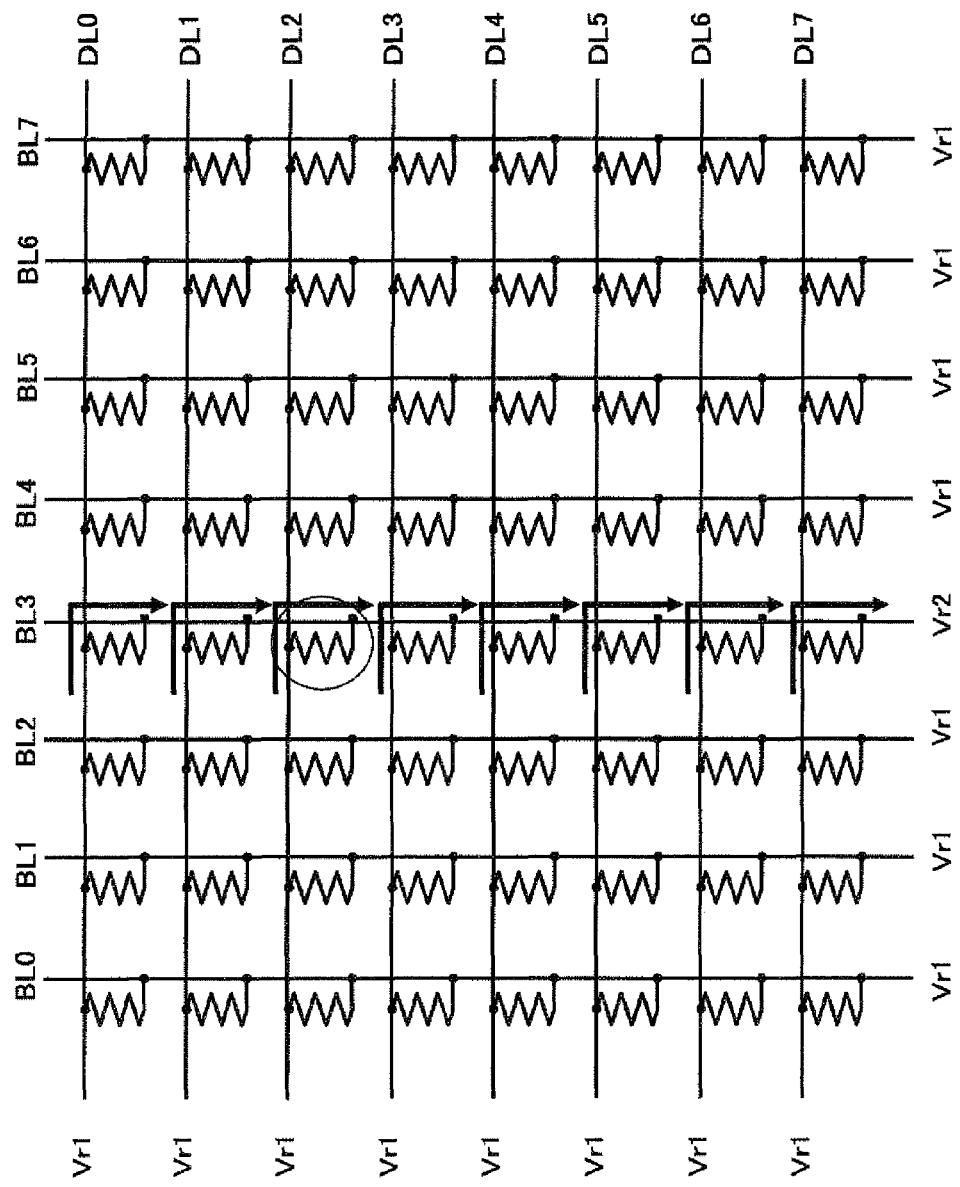
FIG. 16 is a circuit diagram of a memory cell array to explain one example of a reading action of a memory cell array of the semiconductor memory device according to the present invention.

The reading action of the cross point-type memory cell array shown in FIG. 2 is performed such that as shown in FIG. 16, a first reading voltage Vr1 (for example, 2.5V) is applied to all data lines DLi and non-selected bit lines BLj (j≠3), and a second reading voltage Vr2 (for example, 1.5V) is applied to a selected bit line BL3 connected to a selected memory cell to be read, enclosed with a circle. Thus, a current flowing in a selected data line DL2 connected to the selected memory cell is detected and 1/0 of data stored in the selected memory cell is determined.

Figure 17:
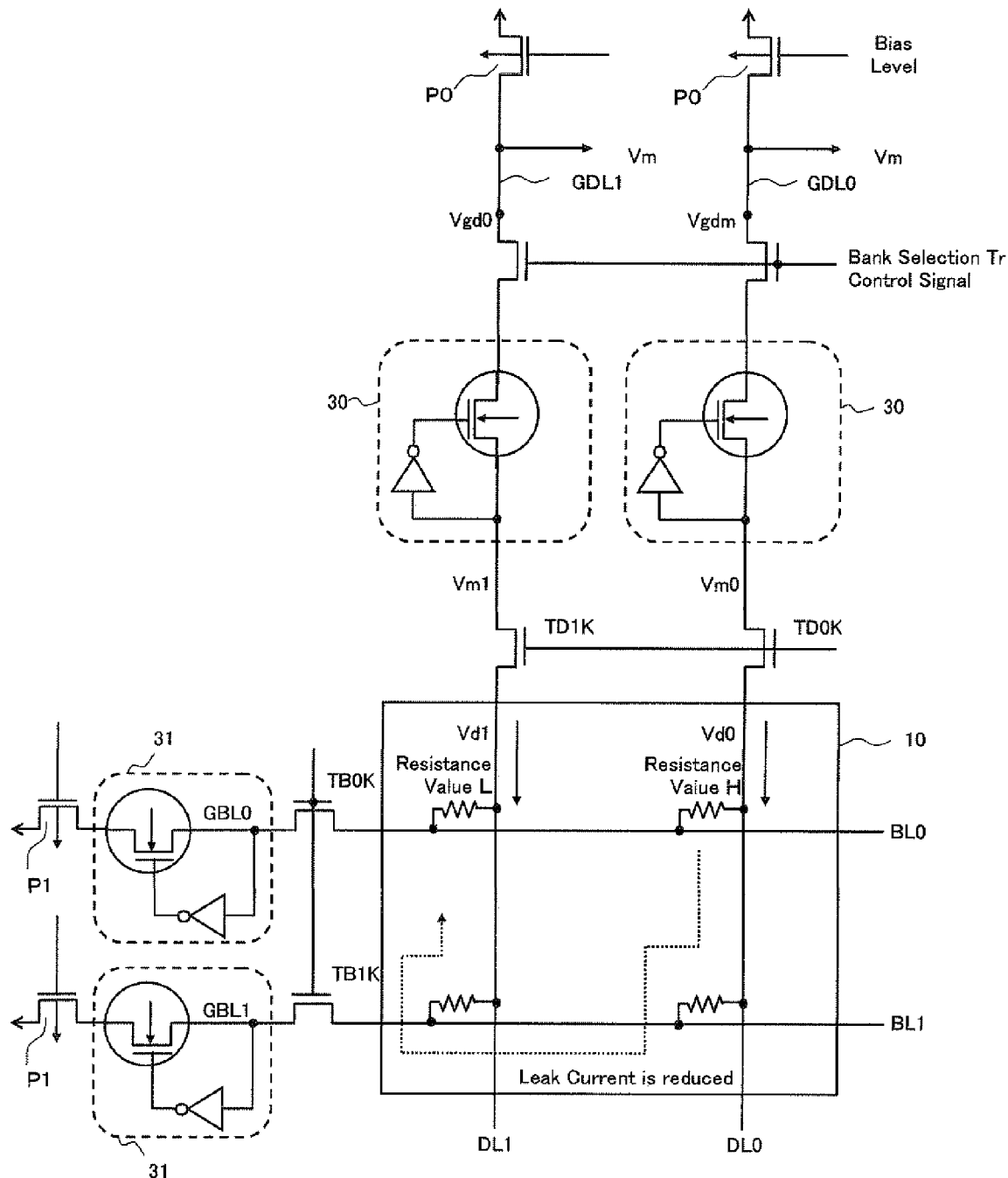
FIG. 17 is a circuit diagram to explain generation mechanism of a leak current at the time of the reading action of the memory cell array of the semiconductor memory device according to the present invention.

A leak current generated through non-selected memory cells at this time becomes a noise component in the reading current flowing in the selected memory cell and superimposes on the current flowing in a selected data line DL5, causing a reading margin to deteriorate. FIG. 17 shows behavior of the leak current. In addition, FIG. 17 simply shows one bank comprising a memory cell array having a constitution of 2 rows×2 columns for simplifying the description. According to the circuit constitution shown in FIG. 17, a row voltage displacement suppression circuit 30 for suppressing the voltage displacement of a main data line GDL0 or GDL1 is provided between a load transistor P0 for supplying the first reading voltage to a data line DL0 or DL1 and the main data line GDL0 or GDL1, and the main data lines GDL0 and GDL1 and the data lines DL0 and DL1 are connected through data line selection transistors TD0k and TD1k, respectively. Furthermore, according to the circuit constitution shown in FIG. 17, a column voltage displacement suppression circuit 31 for suppressing the voltage displacement of a main bit line GBL0 or GBL1 is provided between a load transistor P1 for supplying the second reading voltage to a bit line BL0 or BL1 and the main bit line GBL0 or GBL1, and the main bit lines GBL0 and GBL1 and the bit lines BL0 and BL1 are connected through bit line selection transistors TB0k and TB1k, respectively.

In FIG. 17, it is assumed that a resistance value of a memory cell MS0 connected to the data line DL0 and the selected bit line BL0 is high and a memory cell MS1 connected to the data line DL1 and the selected bit line BL0 is low. Although voltages Vm0 and Vm1 of the main data line GDL0 and GDL1, respectively are almost the same, voltages Vd0 and Vd1 of the data lines DL0 and DL1, respectively become such that Vd0>Vd1 due to the difference in resistance value between the memory cells MS0 and MS1, so that a small voltage difference (Vd0−Vd1) is generated. Due to this voltage difference (Vd−Vd1), a leak current is generated between the data lines DL0 and DL1 through non-selected memory cells.

In this case, although it is necessary to supply the same first reading voltage as the data lines DL0 and DL1 to the non-selected bit line BL1, in order to supply the first reading voltage to the data lines DL0 and DL1 in the bank through the column voltage displacement suppression circuit 31 and the bit line selection transistor TB1k, it is necessary to supply it through each memory cell connected to the non-selected bit line BL1. Therefore, in order to bring the voltages Vd0 and Vd1 of the data lines DL0 and DL1 in the bank, respectively to the same level, it may be effective to supply the first reading voltage from the main data lines GDL0 and GDL1. Therefore, it has advantage to make the current supplying abilities of the data line selection transistors TD0k and TD1k, that is, the transistor sizes greater than the current supplying abilities of the bit line selection transistors TB0k and TB1k, that is, the transistor sizes to reduce the leak current.

Next, a description will be made of a layout constitution of the memory cell array when the transistor size of the data line selection transistor TD1k is made larger than that of the bit line selection transistor TBjk according to the second embodiment. In addition, it is assumed that an array size is 8 rows×8 columns in the following description.

Figure 18:
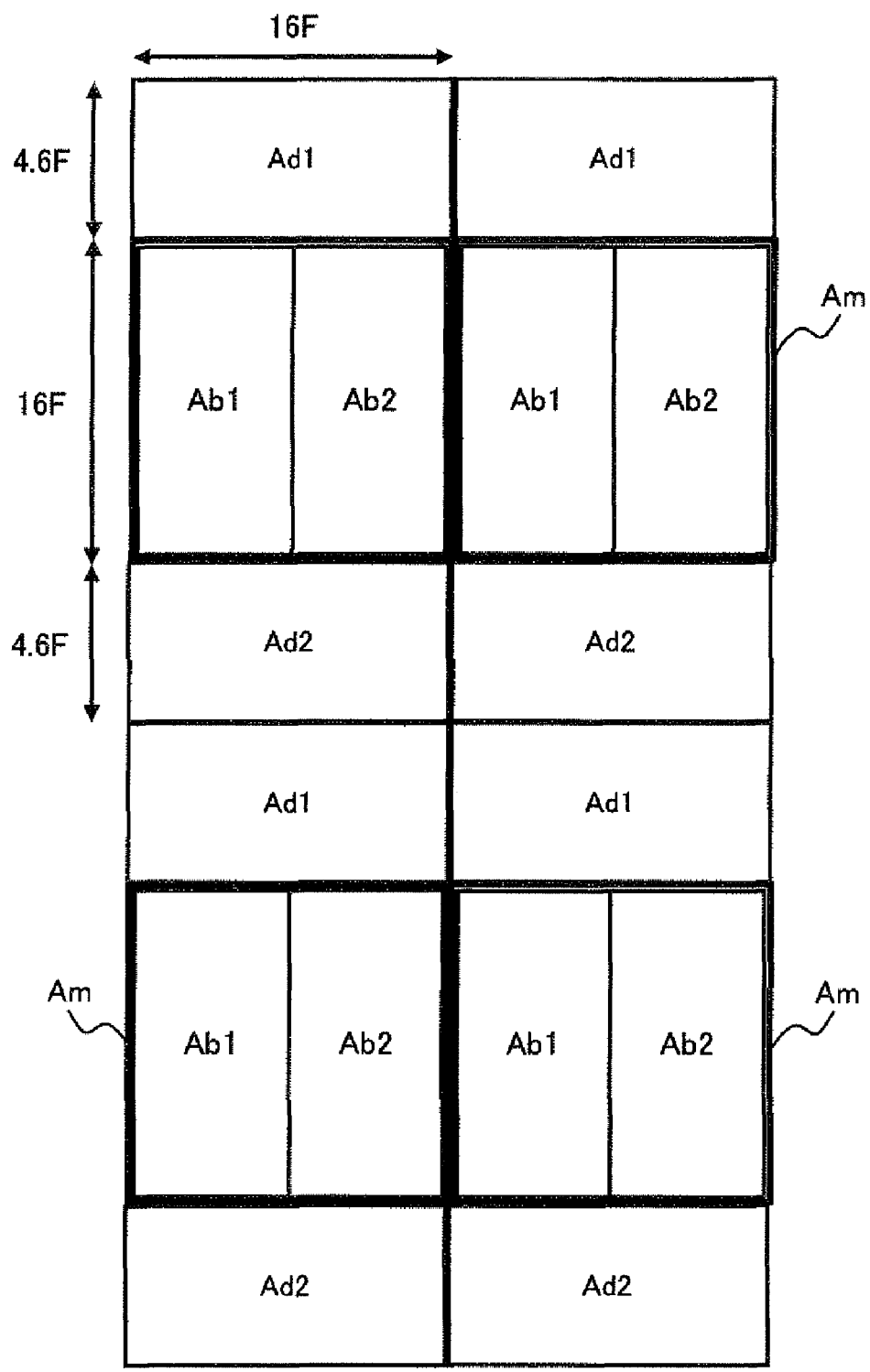
FIG. 18 is a block diagram schematically showing one example of a layout constitution focusing on the reading action to the memory cell array of the semiconductor memory device according to the present invention.

FIG. 18 shows the relation between a memory cell array region (in which memory cells are arranged like a matrix) Am, regions Ad1 and Ad2 in which the even-numbered and odd-numbered data line selection transistors TDik are arranged, respectively and regions Ab1 and Ab2 in which the even-numbered and odd-numbered bit line selection transistors TBjk are arranged, respectively when banks BKk (k=0 to 3) are provided in 2 rows×2 columns. According to this second embodiment, since the transistor size of the data line selection transistor TDik is set to be larger than the transistor size of the bit line selection transistor TBjk, the regions Ad1 and Ad2 of the data line selection transistors TDik are arranged on the underside of the memory cell array region Am. In view of a circuit layout, when the region Ad1 and Ad2 of the data line selection transistors TDik having large areas overlap with the memory cell array region Am to be three-dimensionally structured, the layout area of each bank BKk can be small. In this case, the regions Ab1 and Ab2 of the bit line selection transistors TBjk having smaller size are arranged on both sides of the memory cell array region Am in the column direction.

Figure 19:
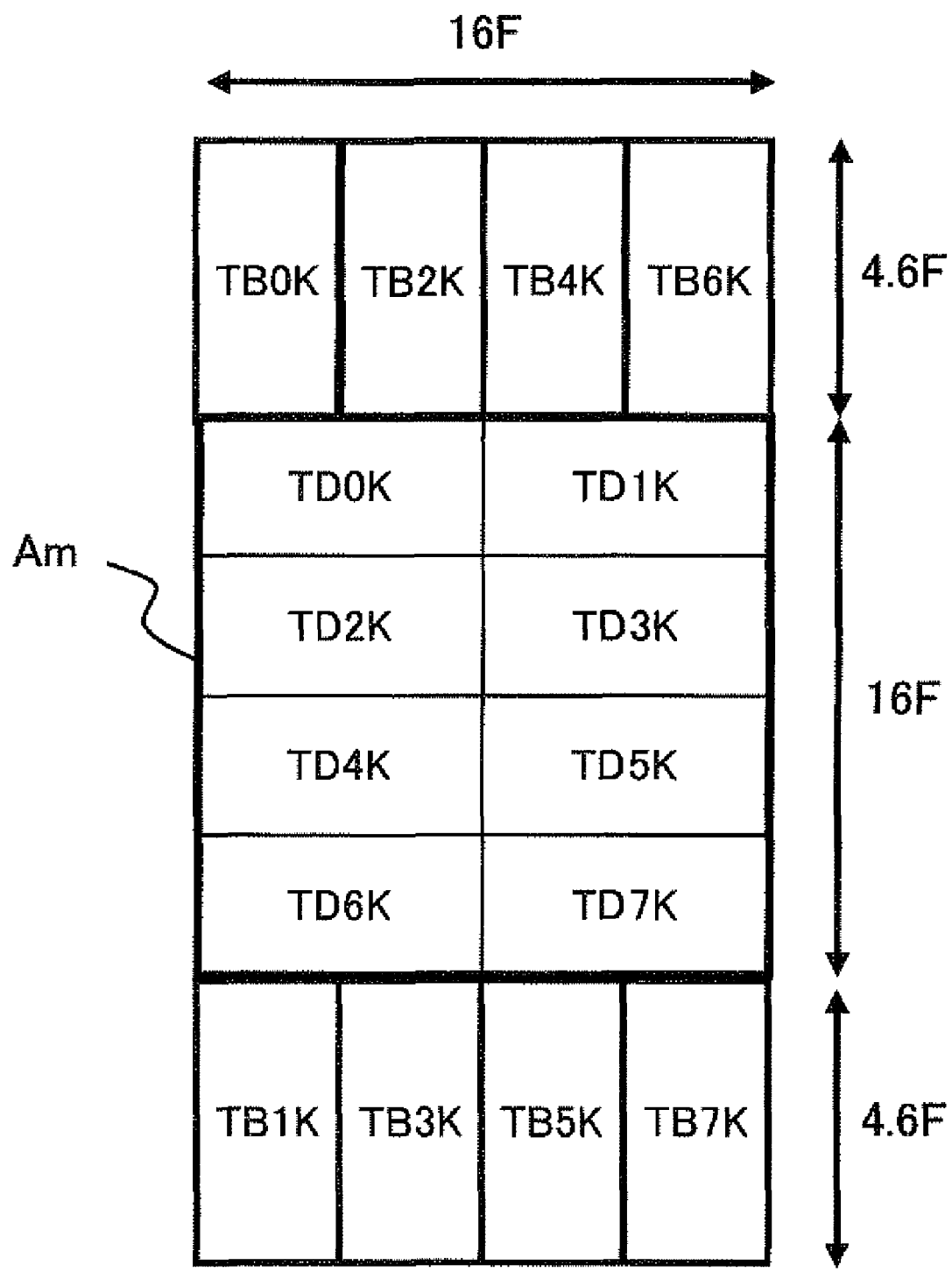
FIG. 19 is a block diagram to explain one example of the layout constitution shown in FIG. 18 with respect to each transistor.
Figure 20:
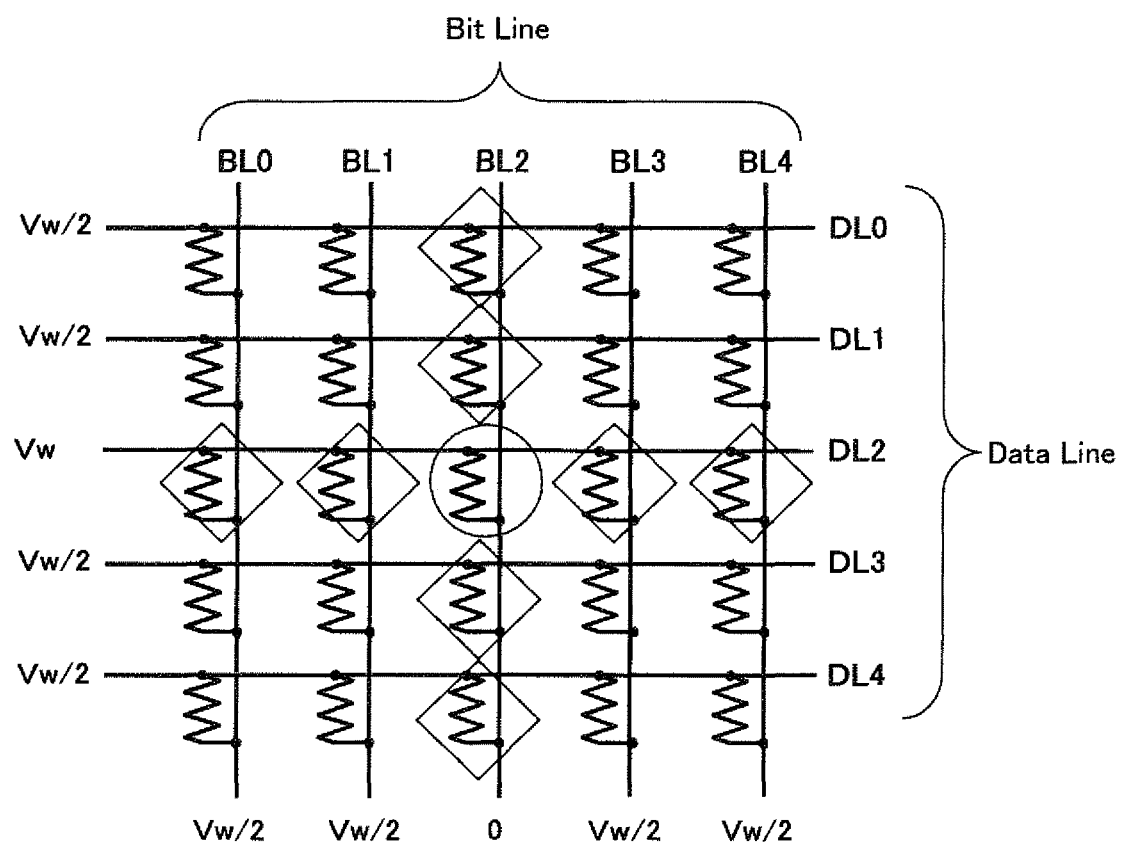
FIG. 20 is a circuit diagrams of a memory cell array to explain one example of a programming action of a memory cell array by a conventional ½ bias method.
Figure 21:
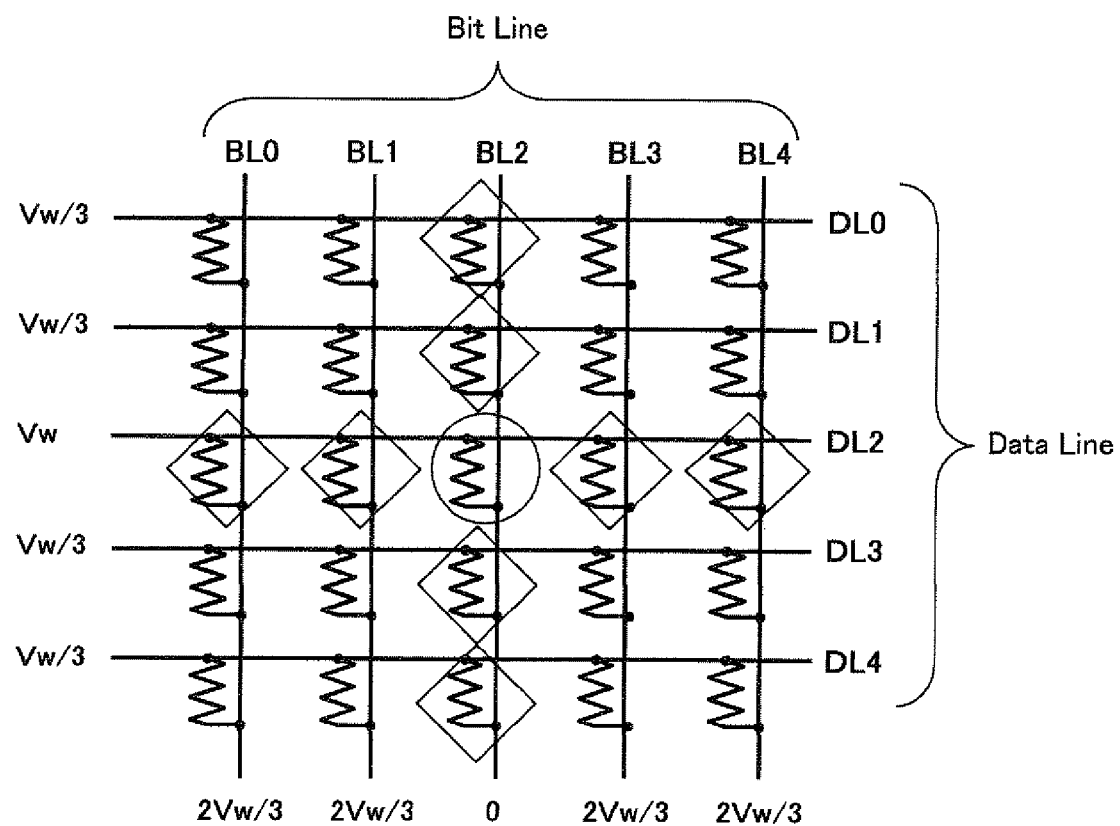
FIG. 21 is a circuit diagrams of a memory cell array to explain one example of a programming action of a memory cell array by a conventional ⅓ bias method.
Figure 22:
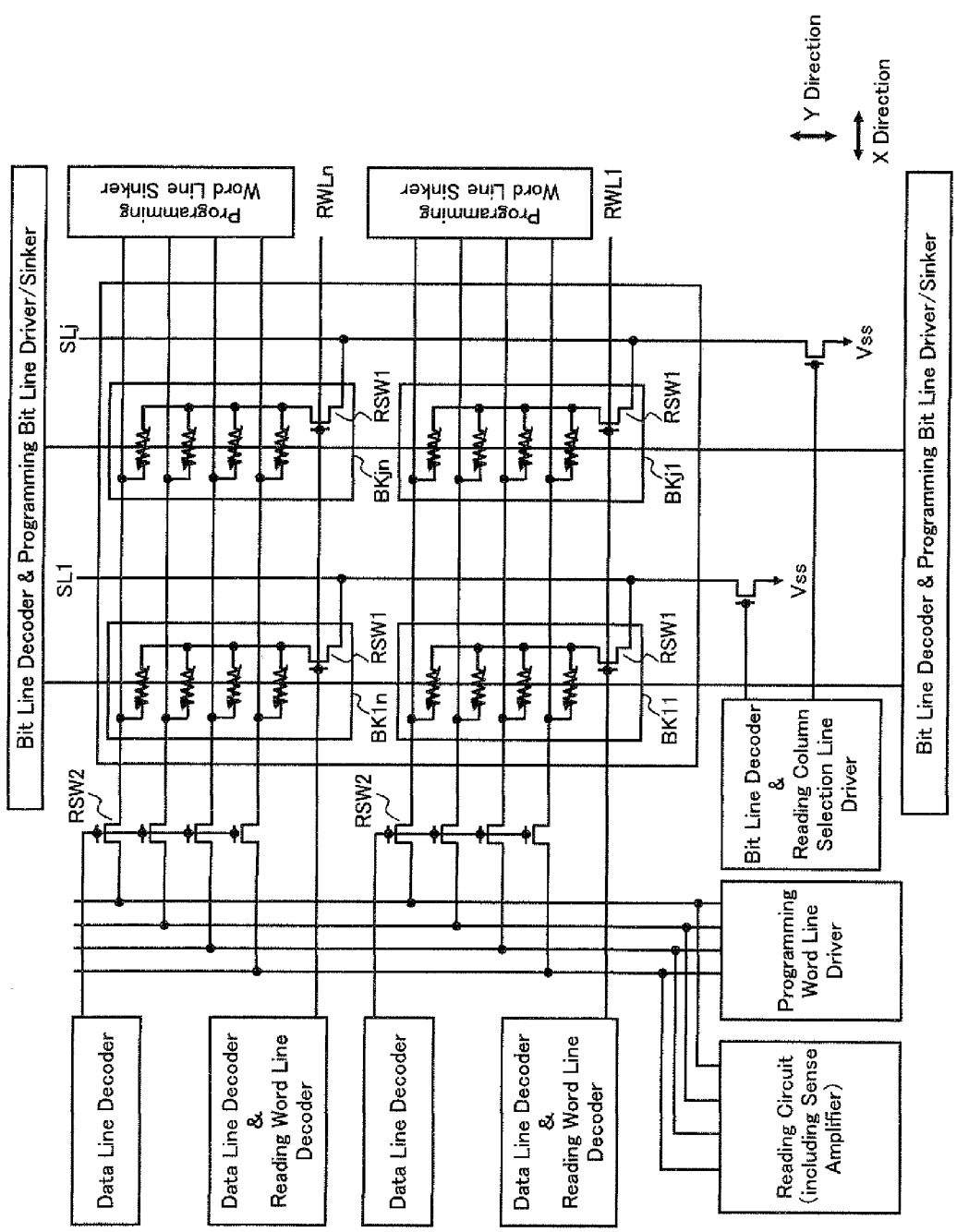
FIG. 22 is a circuit diagram showing a main part of a circuit constitution of a conventional magnetic random access memory.
Figure 23:
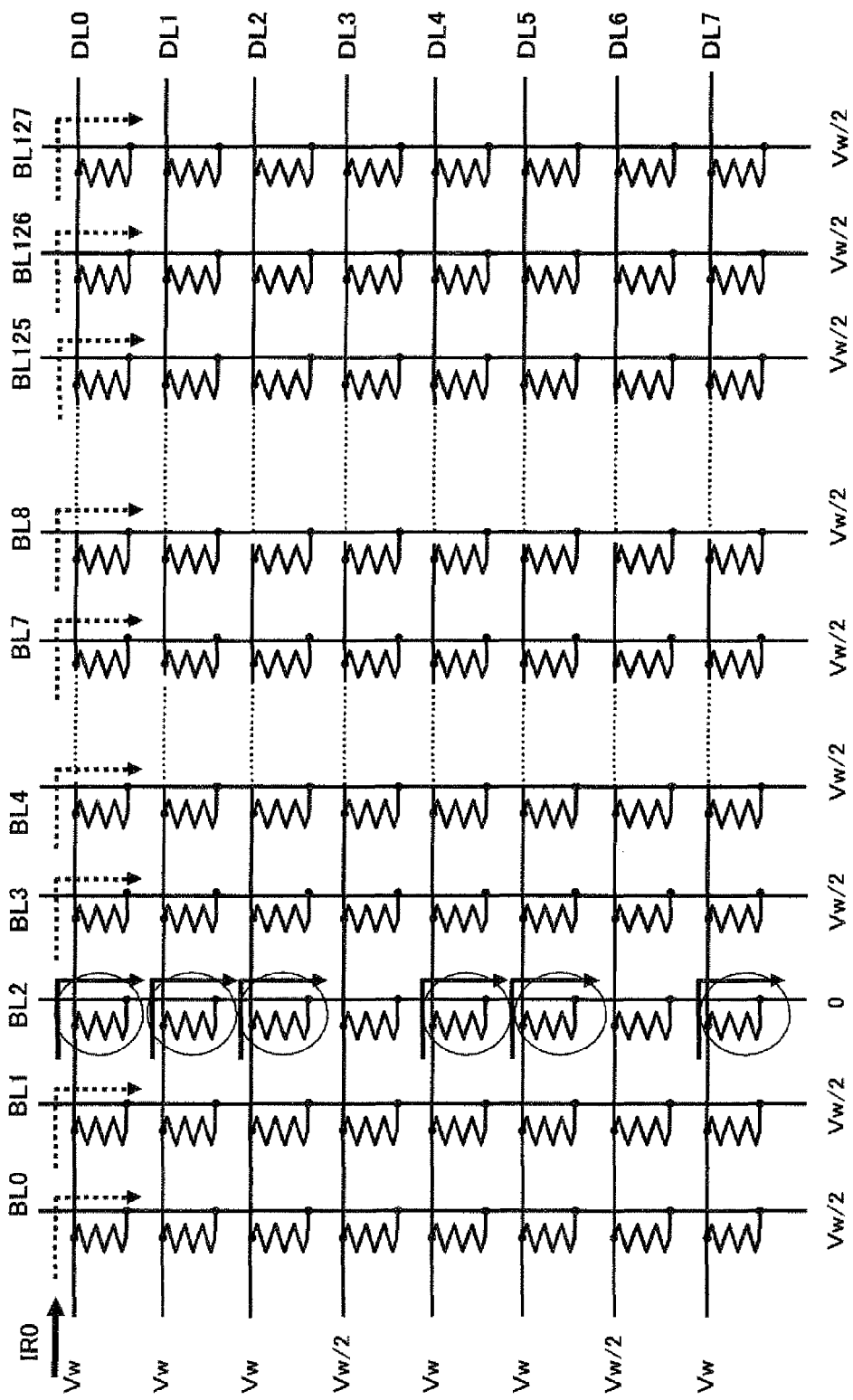
FIG. 23 is a circuit diagram showing a conventional circuit constitution example of a cross point-type memory cell array comprising a variable resistance element formed of a metal oxide in a memory cell.
Figure 24A:
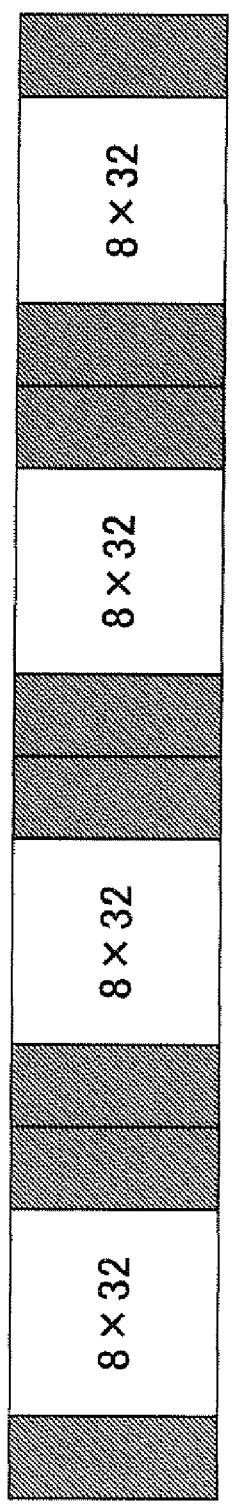
FIG. 24 is a view to compare a block constitution (A) when four banks of a constitution of 8 rows×32 columns are provided in a row direction with a block constitution (B) when one bank of a constitution of 8 rows×128 columns are provided in a row direction.
Figure 24B:
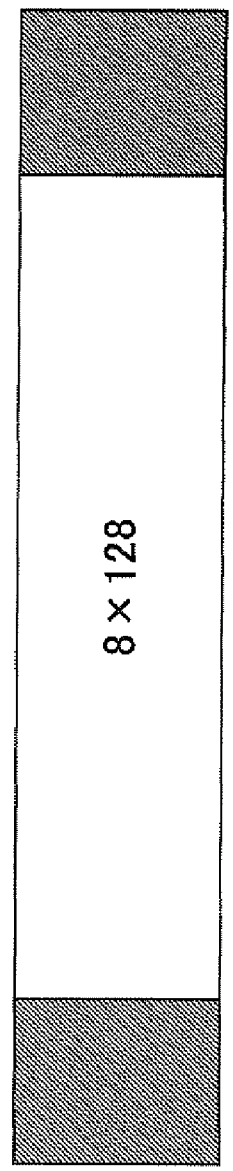

FIG. 19 shows one example of arranged positions for the bit line selection transistors TBjk in the arranged regions Ab1 and Ab2 of the bit line selection transistors TBjk, with respect to each transistor and arranged positions for the data line selection transistor TDik in the arranged regions Ad1 and Ad2 of the data line selection transistors TDik, with respect to each transistor.

In addition, although it has been assumed that the array size is 8 rows×8 columns, even when the memory cell array constitution of each bank has 16 rows×16 columns, 32 rows×32 columns or 64 rows×64 columns, the arranged regions Ad1 and Ad2 of the even-numbered and odd-numbered data line selection transistors TDik having a greater current driving ability are arranged on the underside of the memory cell array region Am and the arranged regions Ab1 and Ab2 of the even-numbered and odd-numbered bit line selection transistors TBjk having a lower current driving ability are arranged on both sides of the memory cell array region Am in the column direction similarly.

In addition, although it has been assumed that the data is read from the side of the main data line GDLi in the above description, when the data is read from the side of the main bit line GBLj, since the relation between the data line and the bit line is reversed, the transistor size of the bit line selection transistor TBjk is set to be larger than the transistor size of the data line selection transistor TDik. Thus, in this case, the arranged regions Ab1 and Ab2 of the even-numbered and odd-numbered bit line selection transistors TBjk having a greater current driving ability are arranged on the underside of the memory cell array region Am and the arranged regions Ad1 and Ad2 of the even-numbered and odd-numbered data line selection transistors TDik having a lower current driving ability are arranged on both sides of the memory cell array region Am in the row direction similar to the first embodiment.

Next, a description will be made of the memory cell used in the device of the present invention according to the first and second embodiments.

The memory cell may have any structure and characteristics as long as it comprises the variable resistance element that stores information by the change of electric resistance. In addition, although it is assumed that a method of changing the electric resistance (that is, a programming method) is an electric programming method in which the electric resistance is changed by application of an electric stress, the characteristic block constitution and layout constitution in the present invention disclosed in the above embodiment can be applied to a memory cell array of memory cells using a method other than the electric programming method. Furthermore, the storage characteristics of the memory cell may be volatile or nonvolatile. In addition, when the device of the present invention is applied to a nonvolatile memory, since the memory cell array can be highly densified, a large-capacity nonvolatile memory can be implemented.

The memory cell includes the following ones. For example, the present invention may be applied to a phase change memory using a phase change of a crystal phase (low resistance) and an amorphous phase (high resistance) in a phase change of a phase transition material such as chalcogenide compound. In addition, the present invention may be applied to a polymer memory and a polymer ferroelectric RAM (PFRAM) in which a memory cell is formed of a fluororesin material and a ferroelectric polarized state is changed due to polarization orientation of fluororesin material molecule (polar conductive polymer molecule).

In addition, the present invention may be applied to the memory cell formed of Mn oxide material such as PCMO ($Pr_{(1-x)}Ca_xMnO_3$) of a perovskite structure having a CMR (Colossal magnetic Resistance) effect.

This uses the fact that the resistance value of the Mn oxide material such as the PCMO constituting a memory cell element is changed due to the change in phase between a ferroelectric metal body and a diamagnetic insulator.

In addition, the present invention can be applied to a memory configured by a memory cell formed of a metal oxide material containing transition metal such as Ni, Ti, Hf and Zr, in which a resistance value is changed by the change of an electric pulse.

Furthermore, the present invention can be applied to a memory configured by a memory cell formed of metal oxide such as $STO(SrTiO_3)$, $SZO(SrZrO_3)$ and $SRO(SrRuO_3)$ and metal fine particle and using an interface phenomenon in which the resistance value of the memory cell is changed by voltage application at the interface between the metal oxide and metal fine particle.

Still furthermore, the present invention can be applied to the following memories in the wider sense.

1) A memory in which a resistance element constituting a memory cell is formed of a semiconductor material.

2) A memory in which a resistance element constituting a memory cell is formed of an oxide or nitride.

3) A memory in which a resistance element constituting a memory cell is formed of a compound of metal and a semiconductor.

4) A memory in which a resistance element constituting a memory cell is formed of a fluororesin material.

5) A polymer ferroelectric RAM (PFRAM) in which a resistance element constituting a memory cell is formed of a conductive polymer.

6) A memory (OUM) in which a resistance element constituting a memory cell is formed of a chalcogenide material.

7) A memory in which a resistance element constituting a memory cell is formed of a compound of a perovskite structure having a CMR effect.

8) A MRAM in which a resistance element constituting a memory cell is formed of a spin-dependent tunneling conjugate element.

INDUSTRIAL APPLICABILITY

A semiconductor memory device according to the present invention can be applied to reduce a current at the time of a programming action of a semiconductor memory device having a cross point-type memory cell array in which memory cells configured by a variable resistance element storing information by a change in electric resistance are arranged in each of a row direction and a column direction and each of the memory cells in the same row has one end connected to a common data line and each of the memory cells in the same column has the other end connected to a common bit line.

The invention claimed is:

1. A semiconductor memory device comprising
memory cell arrays arranged at least in a row direction, the memory cell arrays each including a plurality of memory cells arranged in a row direction and a column direction, the memory cells each having a variable resistance element for storing information by a change of an electric resistance, a plurality of data lines extending in the row direction, and a plurality of bit lines extending in the column direction, in which one end of the variable resistance element of each of the memory cells in the same row is connected to a common data line, and the other end of the variable resistance element of each of the memory cells in the same column is connected to a common bit line, wherein
a plurality of main data lines for supplying a predetermined data line voltage to each of the corresponding data lines of the memory cell arrays arranged in the row direction extend in the row direction,
the main data lines are connected to the corresponding data lines through respective data line selection transistors in the memory cell array, and
the number of the data lines of the memory cell array is equal to the maximum number of the memory cells to be programmed simultaneously in one programming action.

2. The semiconductor memory device according claim 1, wherein
the number of the bit lines is equal to that of the data lines in the memory cell array.

3. The semiconductor memory device according to claim 1, wherein
circuitry for supplying a predetermined data line voltage to the main data lines is arranged separately on both outer sides in the row direction of the memory cell arrays arranged in the row direction.

4. The semiconductor memory device according to claim 3, wherein
circuitry for supplying the predetermined data line voltage to odd-numbered main data lines is arranged on one outer side in the row direction of the memory cell arrays arranged in the row direction and
circuitry for supplying the predetermined data line voltage to even-numbered main data lines is arranged on the other outer side in the row direction of the memory cell arrays arranged in the row direction.

5. The semiconductor memory device according to claim 1, wherein
the memory cell arrays are arranged in the row direction and column direction,
a plurality of main bit lines for supplying a predetermined bit line voltage to each of the corresponding bit lines of the memory cell arrays arranged in the column direction extend in the column direction, and
the main bit lines are connected to the corresponding bit lines through respective bit line selection transistors in the memory cell array.

6. The semiconductor memory device according to claim 5, wherein
in the case where the number of bit lines and the number of data lines are the same in the memory cell array, when a maximum current flowing in the data lines and the bit lines in a programming action is a current flowing in the data lines, a current driving ability of the data line selection transistor is set to be greater than that of the bit line selection transistor, and when the maximum current is a current flowing in the bit lines, a current driving ability of the bit line selection transistor is set to be grater than that of the data line selection transistor.

7. The semiconductor memory device according to claim 5, wherein
a current driving ability of the bit line selection transistor is set to be greater than that of the data line selection transistor.

8. The semiconductor memory device according to claim 6, wherein
at least one part of a transistor group having a greater current driving ability of the data line selection transistors and the bit line selection transistors is arranged on the underside of the memory cell array in a memory cell array region.

9. The semiconductor memory device according to claim 8, wherein
at least one part of a region occupied by a transistor group having a smaller current driving ability of the data line selection transistors and the bit line selection transistors is arranged outside the memory cell array region.

10. The semiconductor memory device according to claim 6, wherein
the data line selection transistors or the bit line selection transistors having a smaller current driving ability are separated into two groups based on the data line or the bit line and arranged in two regions that are outside the memory cell array region and face each other across the memory cell array.

11. The semiconductor memory device according to claim 5, wherein
circuitry for supplying the predetermined bit line voltage to the main bit lines is arranged separately on both outer sides in the column direction of the memory cell arrays arranged in the column direction.

12. The semiconductor memory device according to claim 11, wherein
circuitry for supplying the predetermined bit line voltage to the odd-numbered main bit line is arranged on one outer side in the column direction of the memory cell arrays arranged in the column direction and
circuitry for supplying the predetermined bit line voltage to the even-numbered main bit line is arranged on the other outer side in the column direction of the memory cell arrays arranged in the column direction.

13. The semiconductor memory device according to claim 5, wherein
a current driving ability of the data line selection transistor in a reading action is set to be greater than that of the bit line selection transistor, and the same reading voltage is applied to all the data lines through the data line selection transistors in the reading action in one of the memory cell arrays, so that data is read from a side of the data line.

14. The semiconductor memory device according to claim 13, wherein
at least one part of a transistor group of the data line selection transistors is arranged on the underside of the memory cell array in the memory cell array region.

15. The semiconductor memory device according to claim 14, wherein
at least one part of a region occupied by a transistor group of the bit line selection transistors is arranged outside the memory cell array region.

16. The semiconductor memory device according to claim 5, wherein
a current driving ability of the bit line selection transistor in a reading action is set to be greater than that of the data line selection transistor, and
the same reading voltage is applied to all the bit lines through the bit line selection transistors in the reading action in one of the memory cell arrays, so that data is read from a side of the bit line.

17. The semiconductor memory device according to claim 16, wherein
at least one part of a transistor group of the bit line selection transistors is arranged on the underside of the memory cell array in the memory cell array region.

18. The semiconductor memory device according to claim 17, wherein
at least one part of a region occupied by a transistor group of the data line selection transistors is arranged outside the memory cell array region.

19. The semiconductor memory device according to claim 1, wherein
when all the memory cells connected to one of the bit lines are simultaneously programmed at one programming action in one of the memory cell arrays, in the memory cell array to be programmed,
a first programming voltage is applied to all the data lines,
a second programming voltage is applied to one selected bit line of the bit lines that is connected to the memory cells to be programmed, and
the first programming voltage is applied to non-selected bit lines other than the selected bit line of the bit lines.

20. The semiconductor memory device according to claim 1, wherein
when more than half of the memory cells connected to one of the bit lines are simultaneously programmed at one programming action in one of the memory cell arrays, in the memory cell array to be programmed,
a first programming voltage is applied to a selected data line of the data lines that is connected to the memory cell to be programmed,
a second programming voltage is applied to one selected bit line of the bit lines that is connected to the memory cells to be programmed,
a middle voltage of the first programming voltage and the second programming voltage is applied to non-selected data lines other than the selected data line of the data lines, and
the first programming voltage is applied to non-selected bit lines other than the selected bit line of the bit lines.

21. The semiconductor memory device according to claim 1, wherein
when less than half of the memory cells connected to one of the bit lines are simultaneously programmed at one programming action in one of the memory cell arrays, in the memory cell array to be programmed,
a first programming voltage is applied to a selected data line of the data lines that is connected to the memory cells to be programmed,
a second programming voltage is applied to one selected bit line of the bit lines that is connected to the memory cells to be programmed,
a middle voltage of the first programming voltage and the second programming voltage is applied to non-selected data lines other than the selected data line of the data lines, and
the middle programming voltage is applied to non-selected bit lines other than the selected bit line of the bit lines.

22. The semiconductor memory device according to claim 1, wherein
all the memory cells connected to one of the bit lines are simultaneously reset at one programming action in one of the memory cell arrays, in the memory cell array to be reset,
a first reset voltage is applied to all the data lines,
a second reset voltage is applied to one selected bit line of the bit lines that is connected to the memory cells to be reset, and
the first reset voltage is applied to non-selected bit lines other than the selected bit line of the bit lines.

* * * * *